US006760253B2

(12) United States Patent
Kamei

(10) Patent No.: US 6,760,253 B2
(45) Date of Patent: Jul. 6, 2004

(54) NON-VOLATILE SEMICONDUCTOR MEMORY DEVICE AND METHOD OF DRIVING THE SAME

(75) Inventor: Teruhiko Kamei, Suwa (JP)

(73) Assignee: Seiko Epson Corporation, Tokyo (JP)

(*) Notice: Subject to any disclaimer, the term of this patent is extended or adjusted under 35 U.S.C. 154(b) by 20 days.

(21) Appl. No.: 10/229,064

(22) Filed: Aug. 28, 2002

(65) Prior Publication Data

US 2003/0123303 A1 Jul. 3, 2003

(30) Foreign Application Priority Data

Aug. 30, 2001 (JP) ........................................ 2001-261778

(51) Int. Cl.[7] .............................................. G11C 16/00
(52) U.S. Cl. ............................ 365/185.11; 365/185.05; 365/185.2
(58) Field of Search ....................... 365/185.11, 185.05, 365/185.2, 185.23

(56) References Cited

U.S. PATENT DOCUMENTS

| 5,408,115 | A | | 4/1995 | Chang ........................ 257/324 |
| 5,422,504 | A | | 6/1995 | Chang et al. ............. 365/185.15 |
| 5,494,838 | A | | 2/1996 | Chang et al. ................. 438/264 |
| 5,568,421 | A | * | 10/1996 | Aritome ................. 365/185.17 |
| 5,663,923 | A | | 9/1997 | Baltar et al. ........... 365/239.03 |
| 5,969,383 | A | | 10/1999 | Chang et al. ................. 257/316 |
| 6,177,318 | B1 | | 1/2001 | Ogura et al. ................. 438/267 |
| 6,248,633 | B1 | | 6/2001 | Ogura et al. ................. 438/267 |
| 6,255,166 | B1 | | 7/2001 | Ogura et al. ............. 365/185.27 |
| 6,339,549 | B1 | * | 1/2002 | Jinbo et al. ............. 365/185.11 |
| 6,507,515 | B2 | * | 1/2003 | Taniguchi ............... 365/185.17 |
| 6,587,381 | B2 | * | 7/2003 | Kanai et al. ............ 365/185.28 |

FOREIGN PATENT DOCUMENTS

| JP | A 63-225991 | 9/1988 |
| JP | A 1-300496 | 12/1989 |
| JP | A 7-161851 | 6/1995 |
| JP | B1 2978477 | 9/1999 |
| JP | A 2001-156188 | 6/2001 |

OTHER PUBLICATIONS

U.S. patent application Ser. No. 10/115,913, Kamei, filed Apr. 5, 2002.
U.S. patent application Ser. No. 10/115,956, Kamei, filed Apr. 5, 2002.
U.S. patent application Ser. No. 10/157,897, Kamei et al., filed May 31, 2002.
U.S. patent application Ser. No. 10/157,896, Kamei et al., filed May 31, 2002.
U.S. patent application Ser. No. 10/197,644, Kamei, filed Jul. 18, 2002.
Hayashi, Yutaka et al., "Twin MONOS Cell with Dual Control Gates," 2000 Symposium on VLSI Technology Digest of Technical Papers.
Chang, Kuo–Tung; et al., "A New SONOS Memory Using Source–Side Injection for Programming," IEEE Electron Device Letters, vol. 19, No. 7, Jul. 1998, pp. 253–255.
Chen, Wei–Ming et al., "A Novel Flash Memory Device with S Plit Gate Source Side Injection and ONO Charge Storage Stack (SPIN)," 1997 Symposium on VLSI Technology Digest of Technical Papers, pp. 63–64.

* cited by examiner

Primary Examiner—Tan T. Nguyen
(74) Attorney, Agent, or Firm—Oliff & Berridge, PLC

(57) ABSTRACT

A non-volatile semiconductor memory device in which one I/O line is provided corresponding to one block region. $2^N$ (four, for example) memory cells are provided in one block region. The adjacent memory cells are connected by a connect line. A bit line is connected to each connect line. Four bit lines are provided in one block region. The four bit lines in one block region are commonly connected to the I/O line through first select gates. A second select gate is provided between the bit line which is located at the boundary between the i-th and (i+1)th block regions which are adjacent to each other in a row direction and the I/O line corresponding to the i-th block region.

12 Claims, 31 Drawing Sheets

NON-VOLATILE SEMICONDUCTOR MEMORY DEVICE AND METHOD OF DRIVING THE SAME

Japanese Patent Application No. 2001-261778 filed on Aug. 30, 2001, is hereby incorporated by reference in its entirety.

BACKGROUND OF THE INVENTION

The present invention relates to a non-volatile semiconductor memory device including memory cells each of which has two non-volatile memory elements controlled by one word gate and two control gates, and a method of driving the same.

A known type of non-volatile semiconductor device is a metal-oxide-nitride-oxide semiconductor or substrate (MONOS), wherein a gate insulating layer between the channel and the gate is formed of a multi-layer stack of a silicon oxide film, a silicon nitride film, and a silicon oxide film, and charge is trapped in the silicon nitride film.

This MONOS type of non-volatile semiconductor memory device was disclosed by Y. Hayashi, et al, in 2000 Symposium on VLSI Technology Digest of Technical Papers, pp. 122–123. This document disclosed a MONOS flash memory cell provided with two non-volatile memory elements (MONOS memory elements or cells) controlled by one word gate and two control gates. In other words, each flash memory cell has two charge-trapping sites.

A plurality of MONOS flash memory cells of this configuration are arranged in both a row direction and a column direction, to form a memory cell array region.

Two bit lines, one word line, and two control gate lines are connected to this MONOS flash memory cell.

The operations of this type of flash memory include data erasing, data programming, and data reading. Programming and reading of data are generally performed in 8-bit or 16-bit selected cells (selected non-volatile memory elements) at the same time. Each bit signal is input or output through an I/O line.

Therefore, each of the bit lines connected with each of an appropriate number of memory cells is connected in common with one I/O line through one of a plurality of select gates. One bit line is connected with one I/O line through one of the select gates. Data is read or programmed in an 8-bit or 16-bit unit by performing this operation for eight or sixteen I/O lines at the same time.

A plurality of memory cells arranged in the row direction are divided into an appropriate number of block regions, and each block region corresponds to one I/O line.

Dummy cells having only one of first and second control gates and a word gate are disposed on opposite ends of each block region in a row direction.

Therefore, the number of dummy cells is increased as the number of block regions is increased. This gives rise to a problem in which an effective area of the memory cell array is decreased.

BRIEF SUMMARY OF THE INVENTION

The present invention may provide a non-volatile semiconductor memory device which can be highly integrated by reducing the number of dummy cells, and a method of driving the same.

One aspect of the present invention provides a non-volatile semiconductor memory device comprising:

a memory cell array region in which are arranged a plurality of memory cells at least in a row direction, each of the memory cells having first and second non-volatile memory elements that are controlled by one word gate and first and second control gates;

a plurality of bit lines extending in a column direction, each of the bit lines being connected to a connect line which connects a pair of memory cells adjacent to each other in the row direction;

a plurality of first select gates, each of which is connected to one of the bit lines; and a plurality of I/O lines, each of which is provided for each $2^N$ (N is an integer of 2 or more) first select gates and connected in common to $2^N$ bit lines through $2^N$ first select gates, wherein the memory cell array region is divided into a plurality of block regions in the row direction corresponding to the I/O lines, each of the block regions including $2^N$ memory cells in the row direction; and wherein a second select gate is provided between one of the I/O lines corresponding to the i-th block region (i is an integer) and one of the bit lines, the bit line being located at a boundary between the block regions and connected to the connect line connecting two of the memory cells respectively disposed in the i-th and (i+1)th block regions that are adjacent to each other in the row direction in the block regions.

According to this aspect of the invention, the bit line located at the boundary between the i-th and (i+1)th block regions can be connected to the I/O line corresponding to the i-th block region with the interposed second select gate. This eliminates the need to provide a dummy cell between the block regions, whereby the degree of integration can be increased.

The second select gate may be driven on condition that the memory cell located in an end portion of the i-th block region and connected to one of the bit lines located at the boundary between the block regions is selected and that the bit line located at the boundary between the block regions is connected to one of the I/O lines corresponding to the i-th block region.

The bit line located at the boundary between the block regions may be set at a bit line voltage for programming through the second select gate when programming is performed for the second non-volatile memory element of the memory cell located in an end portion of the i-th block region.

Data reading from the first non-volatile memory element of the memory cell located at an end portion of the i-th block region may be performed in reverse mode by sensing a current flowing into the I/O line through the second select gate and the bit line located at the boundary between the block regions.

Data reading from the second non-volatile memory element of the memory cell located at an end portion of the i-th block region may be performed in forward mode by sensing a current flowing into the I/O line through the second select gate and the bit line located at the boundary between the block regions.

The memory cell array region may be divided into a plurality of sector regions in a row direction; and a plurality of independent control gate driver sections may be provided for each of the sector regions. In this case, each of the control gate driver sections can set the potential of the first and second control gates of the memory cells in a corresponding sector region independently of other sector regions. This prevents occurrence of disturbance in non-selected cells when programming or erasing data.

A dummy cell having one of the first and second control gates and the word gate may be disposed at both ends of each of the sector regions in a row direction. This is because when three memory cells are respectively disposed in adjacent two sectors, the first or second non-volatile memory element of the memory cell in one of the two sectors cannot be driven by using the three memory cells.

The bit lines respectively connected to the connect lines could be sub bit lines and the sub bit lines may be commonly connected to a main bit line extending in a column direction with bit line select switching elements interposed. In this case, the first and second select gates are connected to the main bit line.

Each of the first and second non-volatile memory elements may include an ONO film formed of an oxide film (O), a nitride film (N), and an oxide film (O) as a charge-trapping site, but other configuration could also be used.

According to another aspect of the present invention, there is provided a non-volatile semiconductor memory device which has: a memory cell array region in which are arranged a plurality of memory cells at least in a row direction, each of the memory cells having first and second non-volatile memory elements that are controlled by one word gate and first and second control gates; a plurality of bit lines extending in a column direction, each of the bit lines being connected to a connect line which connects two of the memory cells adjacent to each other in the row direction; a word line which is connected to the word gates of the memory cells arranged in the row direction; and a plurality of control gate lines each of which is connected to the first and second control gates respectively provided in adjacent two memory cells with the connect line interposed, the memory cell array region being divided into a plurality of block regions in the row direction corresponding to the I/O lines, and each of the block regions including $2^N$ memory cells.

In driving this non-volatile semiconductor memory device, a data reading or programming operation is performed for one of the first and second non-volatile memory elements in the i-th memory cell in the row direction by using the word line, four of the bit lines, and four of the control gate lines connected to the (i−1)th, the i-th and the (i+1)th memory cells.

When the i-th memory cell is in an end portion of the block region, this operation is done by using the bit line and the control gate line connected to the (i+1)th memory cell in the block region which is different from the block region in which the i-th memory cell is located.

According to this aspect of the present invention, when three memory cells are respectively disposed in adjacent block regions, the data reading or programming operation can be performed for the first or second non-volatile memory element of one memory cell located at the center of the three memory cells in a row direction by using the three memory cells. Since dummy cells are not present at the boundary between two adjacent block regions, such operation can be achieved.

In this case, the memory cell array region may be divided into a plurality of sector regions in a row direction, each of the sector regions having a plurality of the block regions. In each of the sector regions, a data reading or programming operation can be performed by using the word line, four of the bit lines, and four of the control gate lines connected to the (i−1)th, the i-th and the (i+1)th memory cells respectively disposed in adjacent two block regions. In other words, the memory cells respectively disposed in different sector regions will not be driven at the same time.

In this aspect of the present invention, a dummy cell having one of the first and second control gates and the word gate may be disposed at both ends of each of the sector regions in a row direction; and a data reading or programming operation may be performed for the i-th memory cell by using the bit line and the control gate line connected to the (i−1)th or (i+1)th dummy cell, when the i-th memory cell is in an end portion of the sector region.

DETAILED DESCRIPTION OF THE EMBODIMENT

An embodiment of the present invention is described below with reference to the drawings.

Memory Cell Configuration

Figure 1:
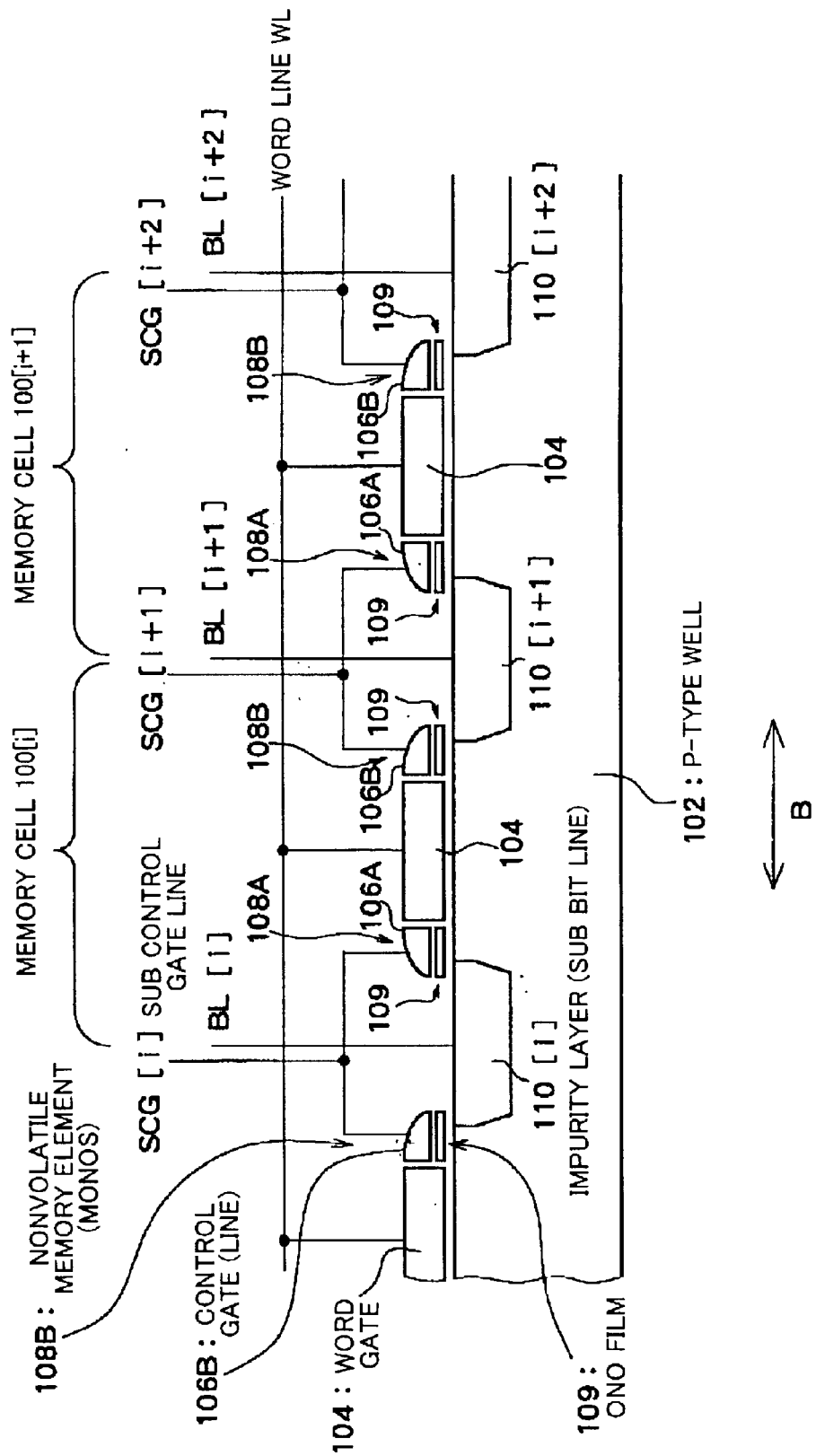
FIG. 1 is a cross-sectional view showing memory cells used in a non-volatile semiconductor memory device according to one embodiment of the present invention.

FIG. 1 is a view showing the cross section of a non-volatile semiconductor memory device. In FIG. 1, one memory cell 100 includes a word gate 104 formed of a material containing polysilicon or the like on a P-type well 102 with a gate oxide film interposed therebetween, first and second control gates 106A and 106B, and first and second memory elements (MONOS memory elements) 108A and 108B.

The first and second control gates 106A and 106B are formed on opposite sidewalls of the word gate 104, and electrically insulated from the word gate 104.

Each of the first and second memory elements 108A and 108B is formed by layering an oxide film (O), a nitride film (N), and an oxide film (O) between one of the first and second control gates 106A and 106B formed of polysilicon corresponding to M (Metal) in MONOS and the P-type well 102. The first and second control gates 106A and 106B may be formed of a conductive material such as a silicide.

As described above, one memory cell 100 includes the first and second MONOS memory elements 108A and 108B, each having a split gate (first and second control gates 106A and 106B). One word gate 104 is shared by the first and second MONOS memory elements 108A and 108B.

The first and second MONOS memory elements 108A and 108B function as charge-trapping sites. Each of the first and second MONOS memory elements 108A and 108B can trap charges in the ONO film 109.

As shown in FIG. 1, a plurality of word gates 104 arranged at intervals in the row direction (second direction B in FIG. 1) is connected in common with one word line WL formed of a polycide or the like.

The control gates 106A and 106B shown in FIG. 1 extend along the column direction (first direction A perpendicular to the surface of FIG. 1), and are shared by a plurality of memory cells 100 arranged in the column direction. Therefore, the control gates 106A and 106B may be referred to as control gate lines.

A sub control gate line SCG [i+1] formed by an upper metal layer of the word gates, control gates and word lines is connected with the control gate line 106B in the [i]th memory cell 100 [i] and the control gate line 106A in the [i+1]th memory cell 100 [i+1].

An [i+1]th impurity layer 110 [i+1] shared by the MONOS memory element 108B in the [i]th memory cell 100 [i] and the MONOS memory element 108A in the [i+1]th memory cell 100 [i+1] is formed in the P-type well 102.

The impurity layers 110 [i], [i+1], and [i+2] are N-type impurity layers formed in the P-type well, for example. The impurity layers 110 [i], [i+1], and [i+2] function as sub bit lines which extend along the column direction (first direction A perpendicular to the surface of FIG. 1), and are shared by a plurality of memory cells 100 arranged in the column direction. Therefore, the impurity layers 110 [i], [i+1], and [i+2] may be referred to as sub bit lines SBL [i], [i+1], and [i+2].

Overall Configuration of Non-volatile Semiconductor Memory Device

The overall configuration of the non-volatile semiconductor memory device including the above-described memory cells 100 is described below with reference to FIGS. 2A to 2E.

Figure 2:
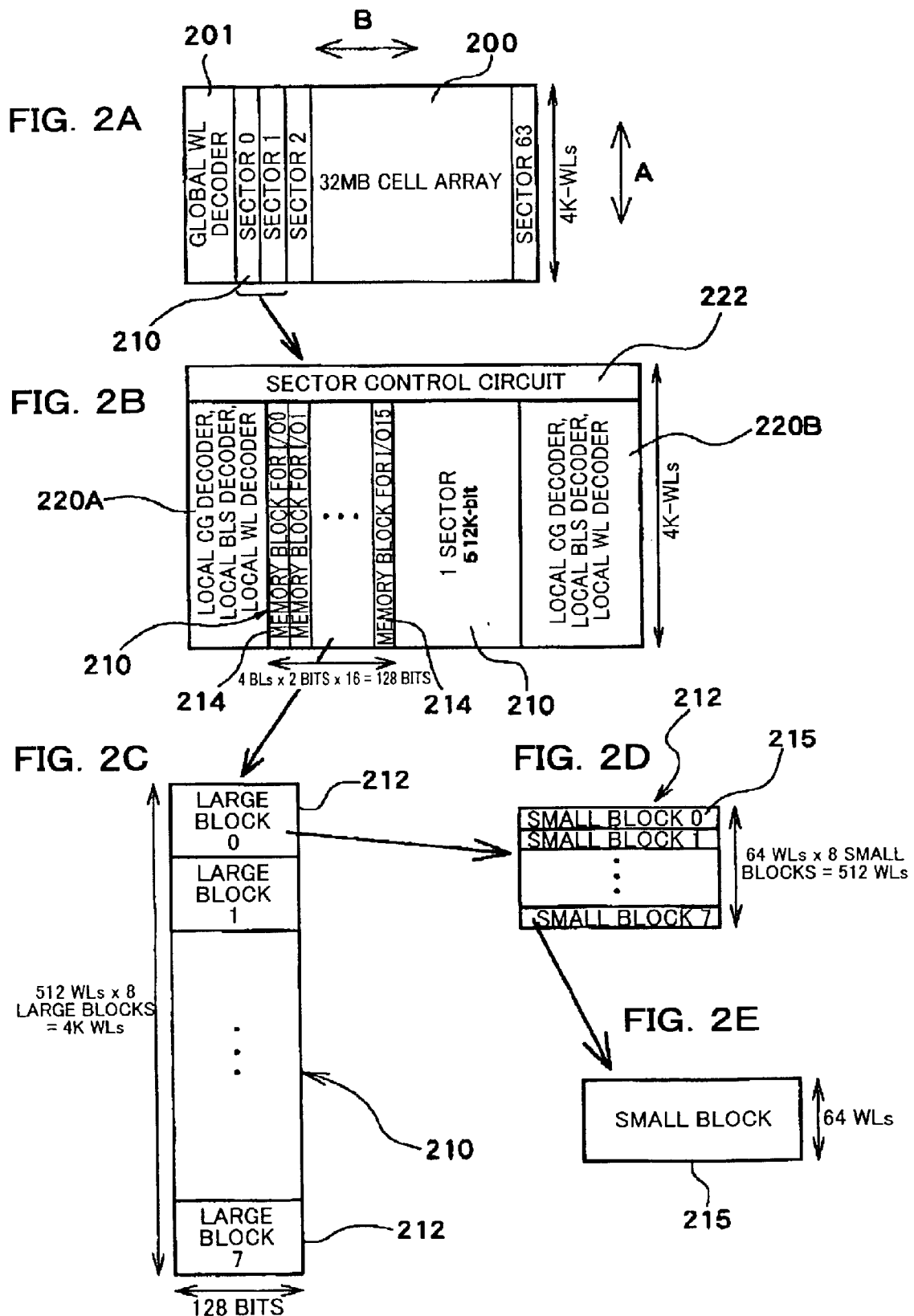
FIG. 2A is a plan view of the layout of the entire non-volatile semiconductor memory device shown in FIG. 1.
FIG. 2B is a plan view showing two sector regions shown in FIG. 2A.
FIG. 2C is a plan view of one sector region shown in FIG. 2B.
FIG. 2D is a plan view of one large block shown in FIG. 2C.
FIG. 2E is a plan view of one small block shown in FIG. 2D.

FIG. 2A is a view showing a planar layout of one chip of the non-volatile semiconductor memory device. The non-volatile semiconductor memory device includes a memory cell array region 200 and a global word line decoder 201. The memory cell array region 200 has 0th to 63rd sector regions (64 in total) 210, for example.

The 64 sector regions 210 are formed by dividing the memory cell array region 200 in the second direction (row direction) B, as shown in FIG. 2A. Each sector region 210 has a rectangular shape in which the first direction (column direction) A is the longitudinal direction. The sector region 210 is a minimum unit of data erasure. Data stored in the sector region 210 is erased either collectively or by time division.

The memory cell array region 200 has 4K word lines WL and 4K bit lines BL, for example. In the present embodiment, since two MONOS memory elements 108A and 108B are connected with one bit line BL. 4K bit lines BL refer to a storage capacity of 8K bits. The storage capacity of each sector region 210 is 1/64 of the storage capacity of the entire memory. Each sector region 210 has a storage capacity defined as (4K word lines WL)×(64 bit lines BL)×2.

FIG. 2B shows details of two adjacent 0th and first sector regions 210 of the non-volatile semiconductor memory device shown in FIG. 2A. As shown in FIG. 2B, local driver regions (including local control gate driver, local bit line select driver, and local word line driver) 220A and 220B are disposed on opposite sides of the two sector regions 210. A sector control circuit 222 is disposed on the upper sides of the two sector regions 210 and the local driver regions 220A and 220B, for example.

Each sector region 210 is divided in the second direction and has 16 memory blocks 214 for I/O0 to I/O15 (memory blocks corresponding to input/output bits) so that 16-bit data can be read out or written in. Each memory block 214 has 4K (4096) word lines WL, as shown in FIG. 2B.

As shown in FIG. 2C, each sector region 210 shown in FIG. 2B is divided into eight large blocks 212 in the first direction A. Each large block 212 is divided into eight small blocks 215 in the first direction A, as shown in FIG. 2D.

Each small block 215 has 64 word lines WL, as shown in FIG. 2E.

Sector Region Details

Figure 3:
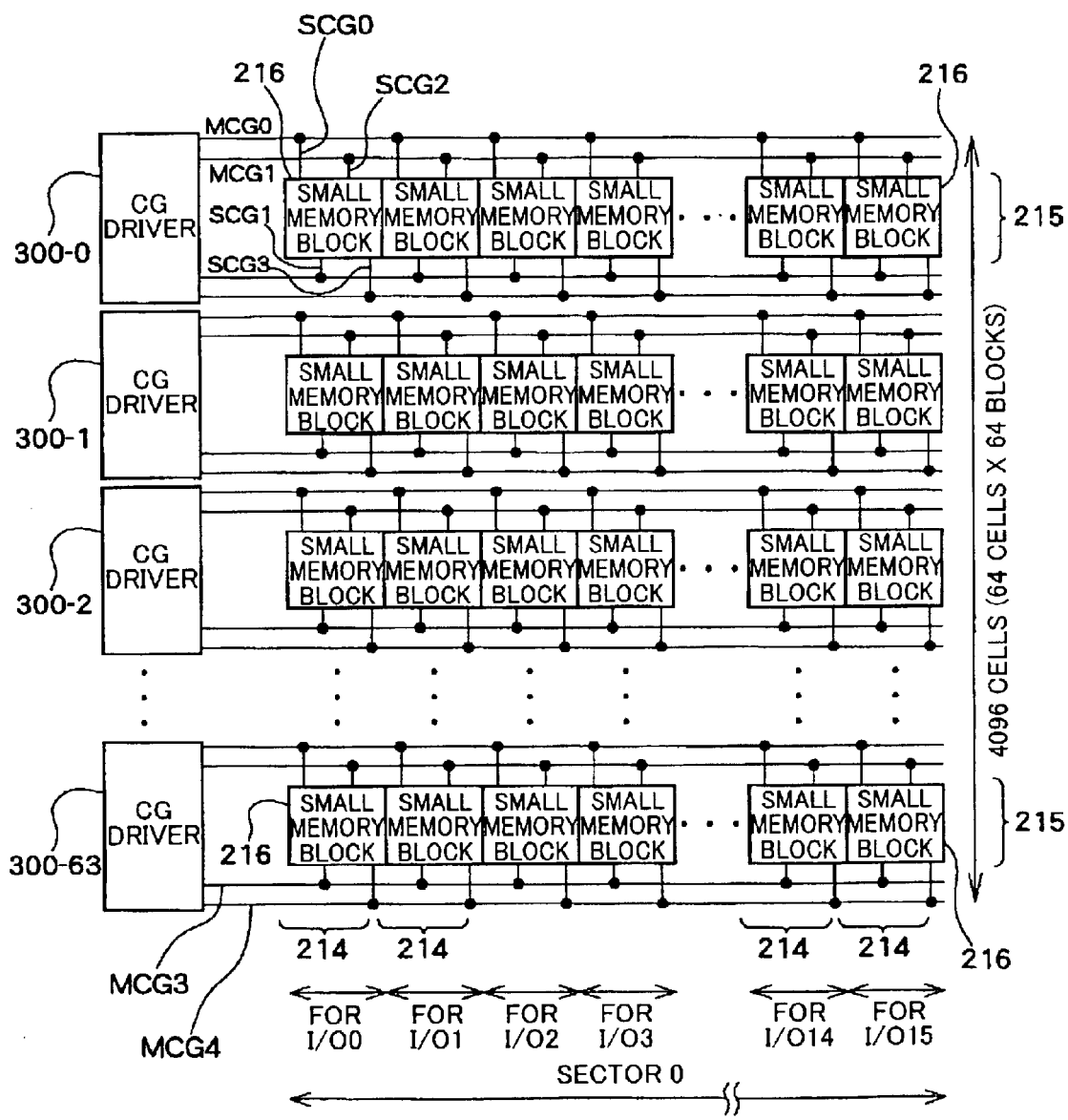
FIG. 3 is a diagram schematically showing a number of small memory blocks and interconnects in one sector region shown in FIG. 2B.
Figure 4:
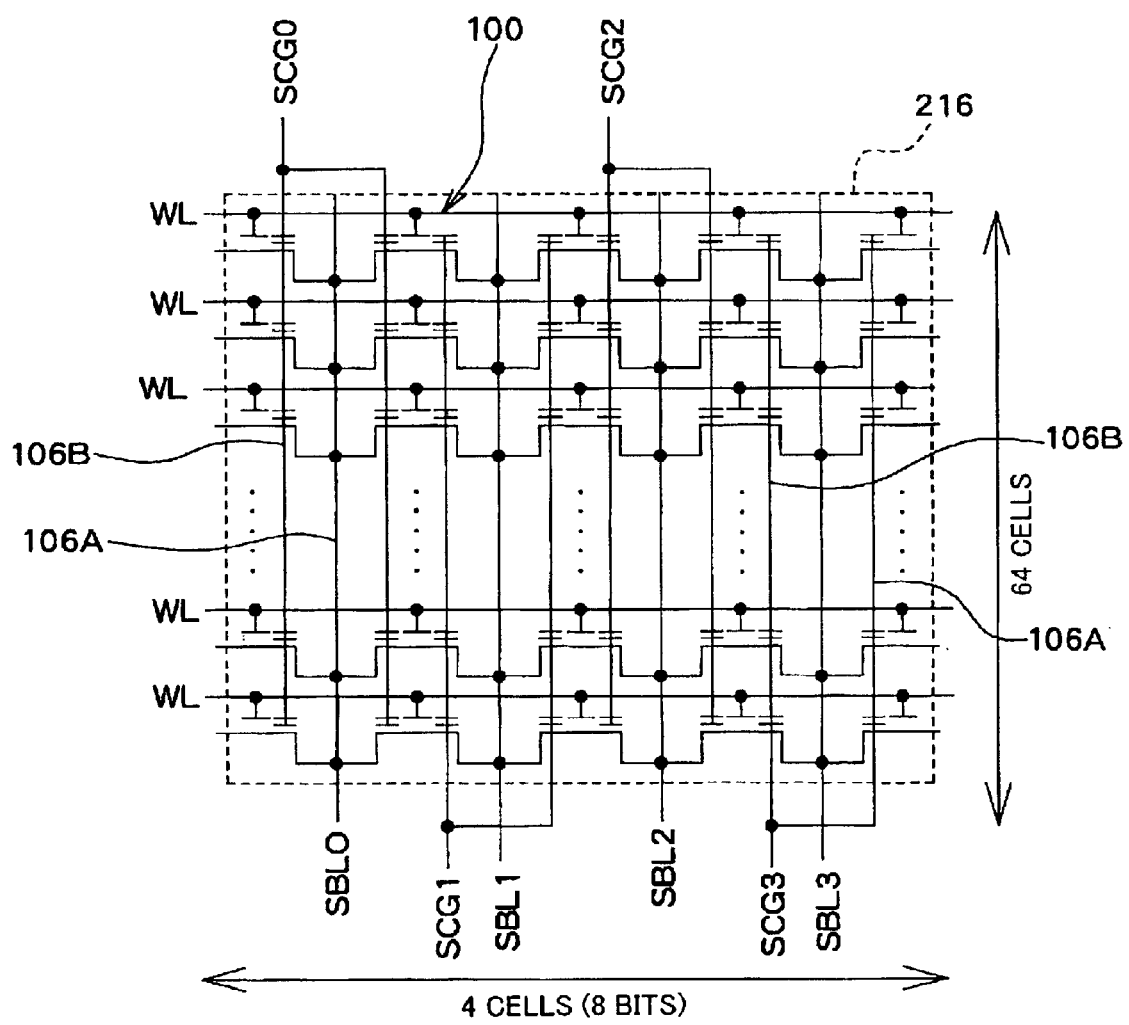
FIG. 4 is a circuit diagram of the small memory block shown in FIG. 3.

FIG. 3 is a view showing details of the sector region 0 shown in FIG. 2A. In the small memory block 216 shown in FIG. 3, 64 memory cells 100 are arranged in the column direction and four memory cells 100 are arranged in the row direction as shown in FIG. 4, for example. Four sub control gate lines SCG0 to SCG3, four sub bit lines SBL0 to SBL3 which are data input/output lines, and 64 word lines WL are connected with one small memory block 216.

The second control gates 106B of a plurality of memory cells in the even-numbered column (0th column or second column) and the first control gates 106A of a plurality of memory cells in the odd-numbered column (first column or third column) are connected in common with the even-numbered sub control gate lines SCG0 and SCG2. The second control gates 106B of a plurality of memory cells in the odd-numbered column (first column or third column) and the first control gates 106A of a plurality of memory cells in the even-numbered column (second column or fourth column) are connected in common with the odd-numbered sub control gate lines SCG1 and SCG3.

As shown in FIG. 3, 64 small memory blocks 216 are arranged in the column direction (these small memory blocks 216 make up small block 215) in one memory block 214, and 16 memory blocks 214 corresponding to I/O0 to I/O15 are arranged in the row direction for performing 16-bit input/output.

Sixteen sub control gate lines SCG0 of 16 small memory blocks 216 arranged in the row direction are connected in common with a main control gate line MCG0 in the row direction. Sixteen sub control gate lines SCG1 are connected in common with a main control gate line MCG1. Sixteen sub control gate lines SCG2 are connected in common with a main control gate line MCG2. Sixteen sub control gate lines SCG3 are connected in common with a main control gate line MCG3.

One of a plurality of CG drivers 300-0 to 300-63 (control gate driver sections) is provided to each small block 215 in the sector region 0. Four main control gate lines MCG0 to MCG3 extending in the row direction are connected with each of the CG drivers 300-0 to 300-63.

Figure 5:
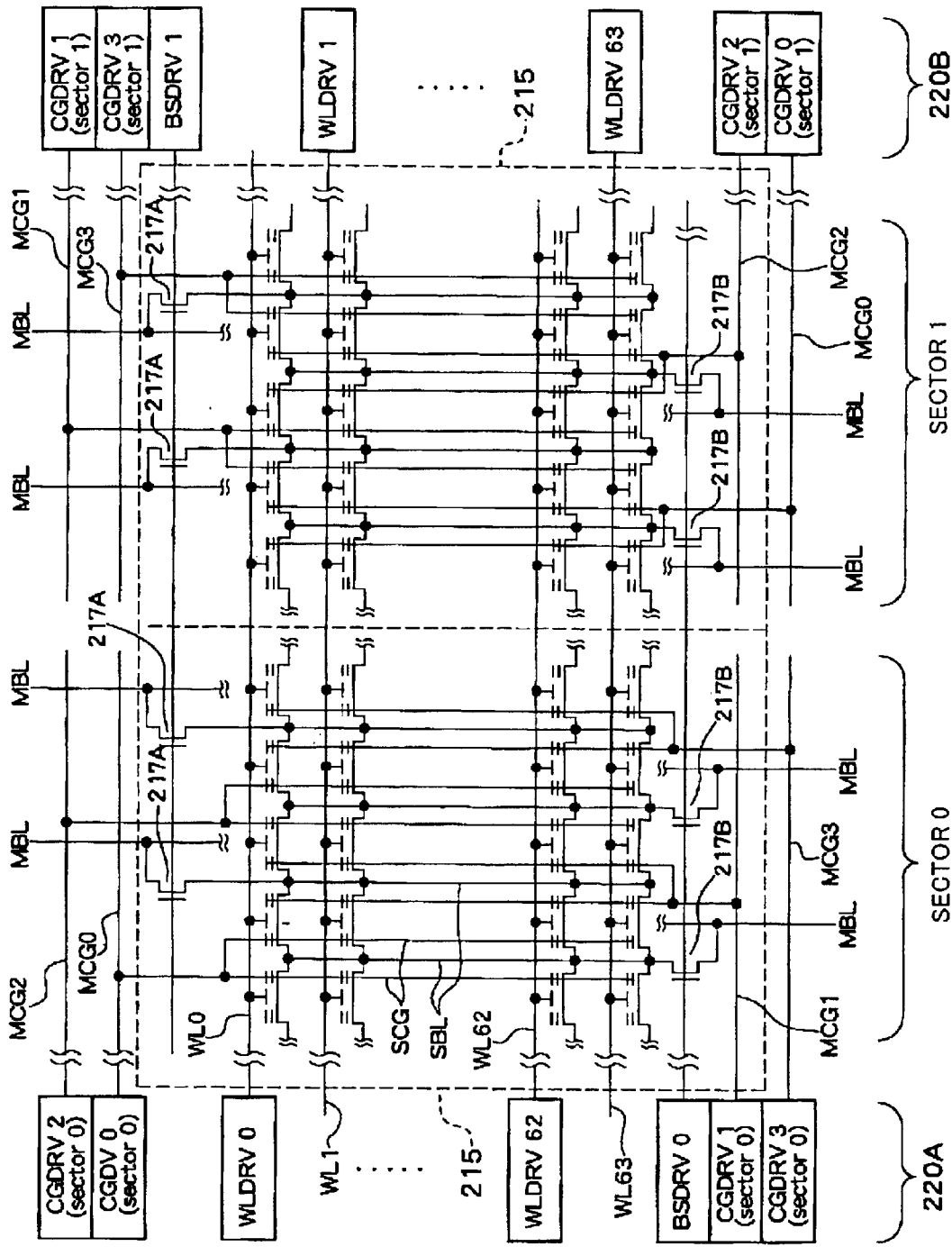
FIG. 5 is a view showing the relationship between the small blocks of FIG. 3 and local driver regions.

FIG. 5 is a view showing the relation between two small blocks 215 which belong to either the sector region 0 or the sector region 1 adjacent to the sector region 0. 64 word lines WL0 to WL63 are shared by the sector region 0 and the sector region 1. The main control gate lines MCG0 to MCG3 and the main bit lines MBL are independently provided to the sector region 0 and the sector region 1. In FIG. 5, CG drivers CGDRV 0 to 3 corresponding to the small block 215 in the sector region 0 and CG drivers CGDRV 0 to 3 corresponding to the small block 215 in the sector region 1 are illustrated. The CG driver is independently provided at each small block 215.

Each sub bit line SBL0 (impurity layer) disposed in each small block 215 is connected in common with the main bit line MBL which is a metal interconnect. The main bit line MBL is shared by the small memory blocks 216 arranged in the column direction (first direction A). Bit line select gates 217A and 217B (bit line select switching elements) are disposed in each path from the main bit line MBL to each sub bit line SBL0 in the small memory block 216. The bit line select gate 217A is connected with the odd-numbered sub bit lines SBL, and the bit line select gate 217B is connected with the even-numbered sub bit lines SBL, for example.

Figure 6:
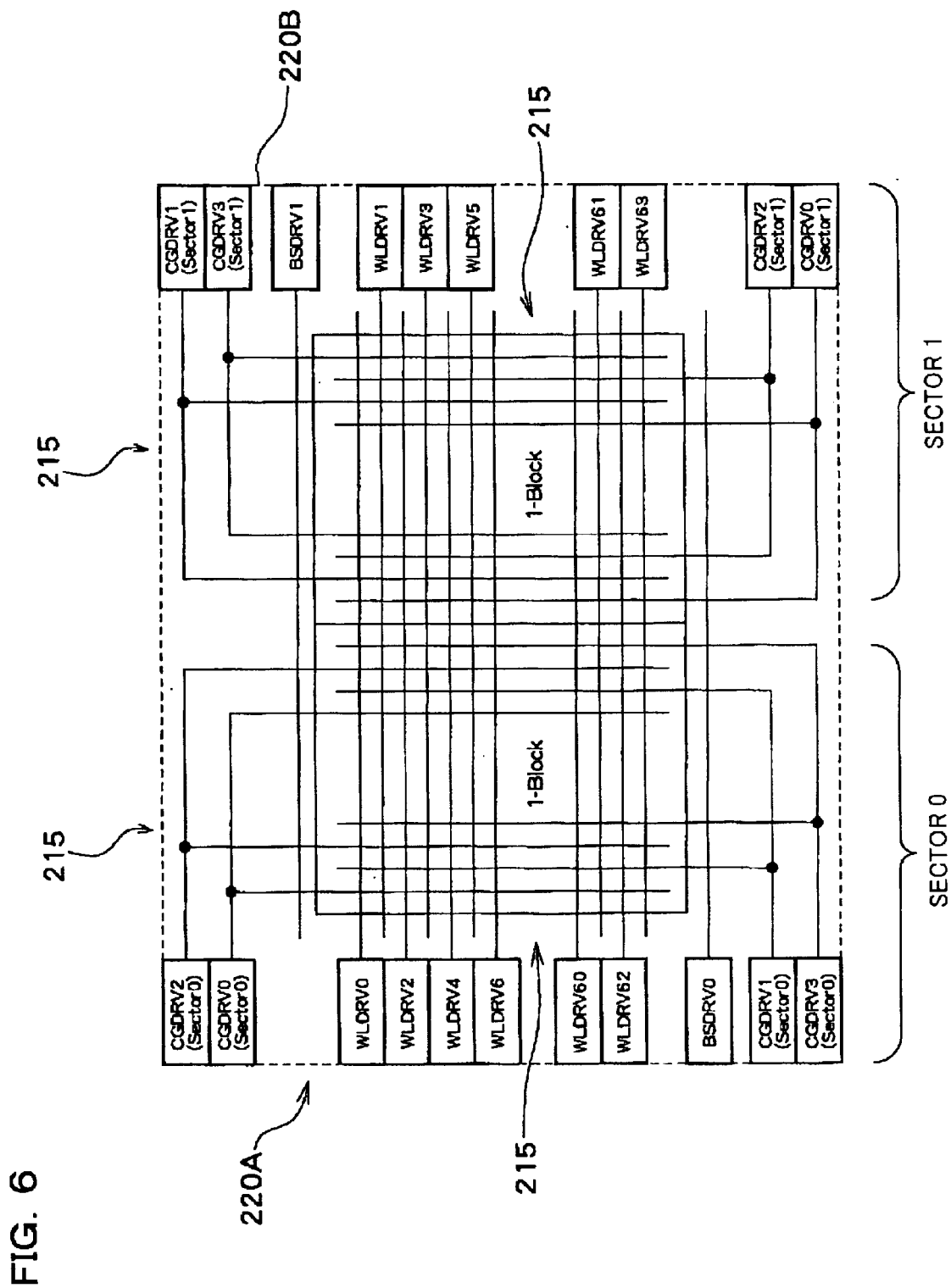
FIG. 6 is a diagram schematically showing the relationship between two small blocks in two adjacent sectors and the local driver regions.

FIG. 6 shows details of two small blocks 215 in the adjacent 0th and first sector regions 210 and the local driver regions 220A and 220B on either side of the small blocks 215. As shown in FIG. 6, four local control gate line drivers CGDRV0 to CGDRV3 shown in FIG. 5 are disposed in the local driver region 220A on the left. Four local control gate line drivers CGDRV0 to CGDRV3 shown in FIG. 5 are disposed in the local driver region 220B on the right.

Local word line drivers WLDRV0 ... WLDRV62 which drive even-numbered word lines WL0, 2, ... 62 in the sectors 0 and 1 are disposed in the local driver region 220A on the left. Local word line drivers WLDRV1 ... WLDRV63 which drive odd-numbered word lines WL1, 3, ... 63 in the sectors 0 and 1 are disposed in the local driver region 220B on the right.

As shown in FIGS. 5 and 6, a local bit line driver BSDRV1 which drives the bit line select gate 217A connected with the odd-numbered sub bit lines SBL in the sectors 0 and 1 is disposed in the local driver region 220B on the right, for example. A local bit line driver BSDRV0 which drives the bit line select gate 217B connected with the even-numbered sub bit lines SBL in the sectors 0 and 1 are disposed in the local driver region 220A on the left, for example.

Driver Circuit of Sectors 0 and 1

Circuits which drive the memory cells in each small block 215 in the sectors 0 and 1 are described below with reference to FIG. 7.

A predecoder 400, 64 global decoders 402-0 to 402-63, and a Y decoder 404 are provided and shared by the sectors 0 to 63.

The predecoder 400 decodes an address signal A[20-0] which specifies a non-volatile memory element to be selected (selected cell). The meaning of the address signal A[20-0] is shown in Table 1.

TABLE 1

| Address | Group | Function | |
|---|---|---|---|
| A[20:15] | Sector | Choose 1 of 64 | |
| A[14:12] | Row | Choose 1 of 8 | |
| A[11:9] | Large block | Choose 1 of 8 | Choose 1 of 4096 |
| A[8:6] | Small block | Choose 1 of 8 | |
| A[5:0] | Column | Choose 1 of 64 | |

The Y decoder 404 drives a Y-pass circuit 412 through a Y-pass select driver 410, thereby connecting the selected bit line in the small block 215 with a sense amplifier or a bit line driver in the subsequent stage.

As described with reference to FIGS. 5 and 6, the local driver regions 220A and 220B are provided on opposite sides of each small block 215 shown in FIG. 7.

Taking the small memory blocks 0 in the first row in the sectors 0 and 1 as examples, the control gate line driver CGDRV [3-0] which drives four main control gate lines MCG in the sector 0, the word line driver WLDRV [31-0] which drives the even-numbered 31 word lines WL in the sectors 0 and 1, and the bit line select driver BSDRV [0] which drives bit line select transistor 217B connected with the even-numbered sub bit lines SBL in the sectors 0 and 1 are disposed in the local driver region 220A on the left of the small memory blocks 0. The control gate line driver CGDRV [3-0] which drives four main control gate lines MCG in the sector 1, the word line driver WLDRV [63-32] which drives the odd-numbered 31 word lines WL in the sectors 0 and 1, and the bit line select driver BSDRV [1] which drives the bit line select transistor 217A connected with the odd-numbered sub bit lines SBL in the sectors 0 and 1 are disposed in the local driver region 220B on the right of the small memory blocks 0.

Details of the sector control circuit 222 disposed on the upper side of the sectors 0 and 1, for example, are described below with reference to FIG. 7.

Two control gate voltage control circuits EOCTL provided corresponding to the sectors 0 and 1 output two types of control gate high voltages VPCG [1:0] which are set at a potential of either VP1 or VP2 based on the predecoded output from the predecoder 400. Specifically, if the control gate high voltage VPCG [0] is at VP1, the control gate high voltage VPCG [1] is at VP2.

The voltages VP1 and VP2 are generated by a charge-pump circuit (not shown), and set at a charge-pump voltage which differs depending on the mode. For example, VP1 and VP2 are respectively 1.5 V and 3 V when reading data. VP1 and VP2 are respectively 5.5 V and 2.5 V when programming data.

Figure 8:
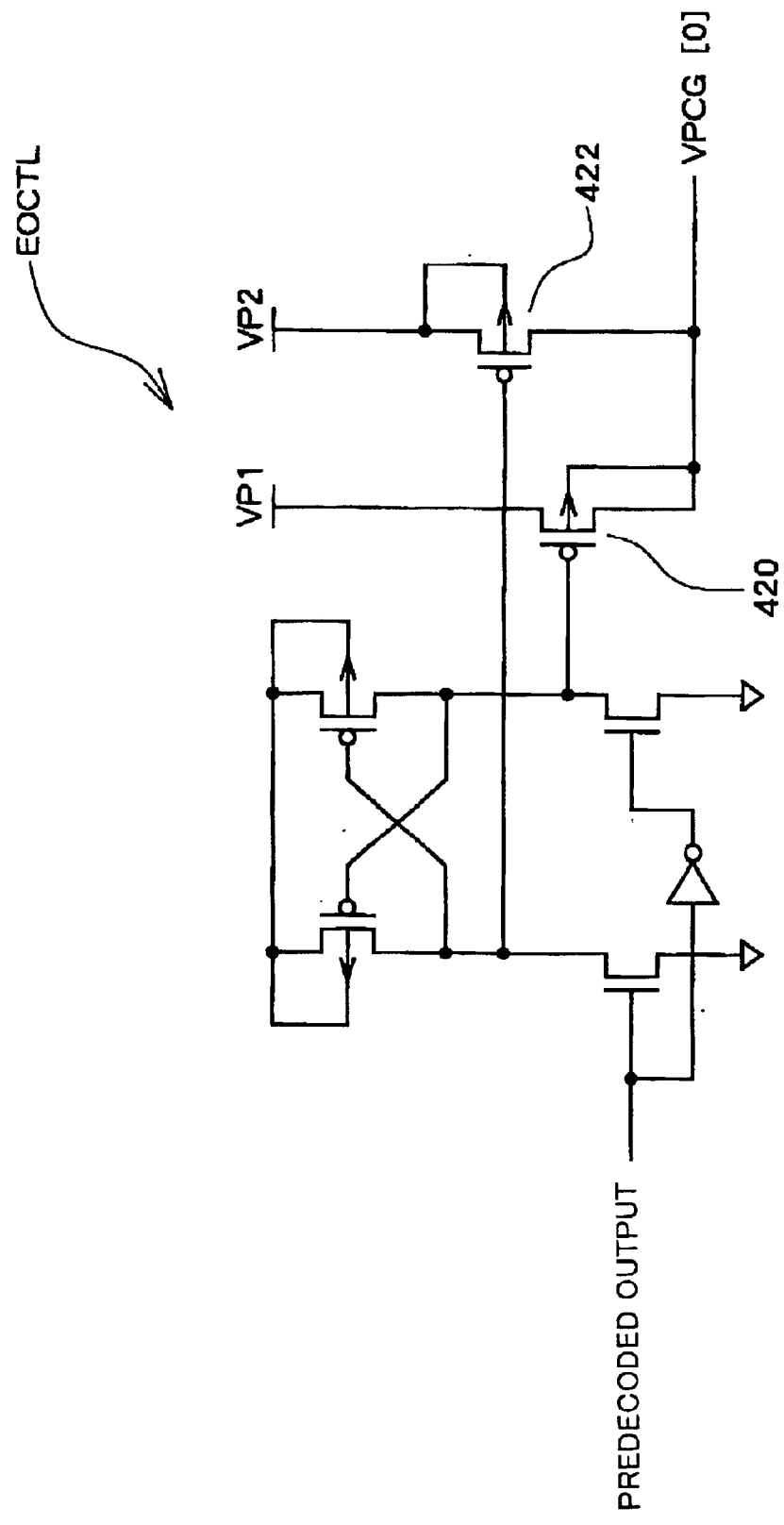
FIG. 8 is a circuit diagram showing an example of a control gate voltage control circuit EOCTL of FIG. 7.

FIG. 8 shows an example of the control gate voltage control circuit EOCTL which outputs the control gate high voltage VPCG [0]. In FIG. 8, if the predecoded output is HIGH, a P-type MOS transistor 420 is turned OFF and a P-type MOS transistor 422 is turned ON, whereby VP2 is output as the control gate high voltage VPCG [0]. If the predecoded output is LOW, the P-type MOS transistor 420 is turned ON and the P-type MOS transistor 422 is turned OFF, whereby VP1 is output as the control gate high voltage VPCG [0].

Two precontrol gate line drivers PCGDRV provided corresponding to the sectors 0 and 1 output a driver select signal PCG [3:0] which causes one of four control gate line drivers CGDRV 0 to 3 provided corresponding to the small blocks 215 in the sectors 0 and 1 to be ACTIVE based on the predecoded output from the predecoder 400.

Figure 9:
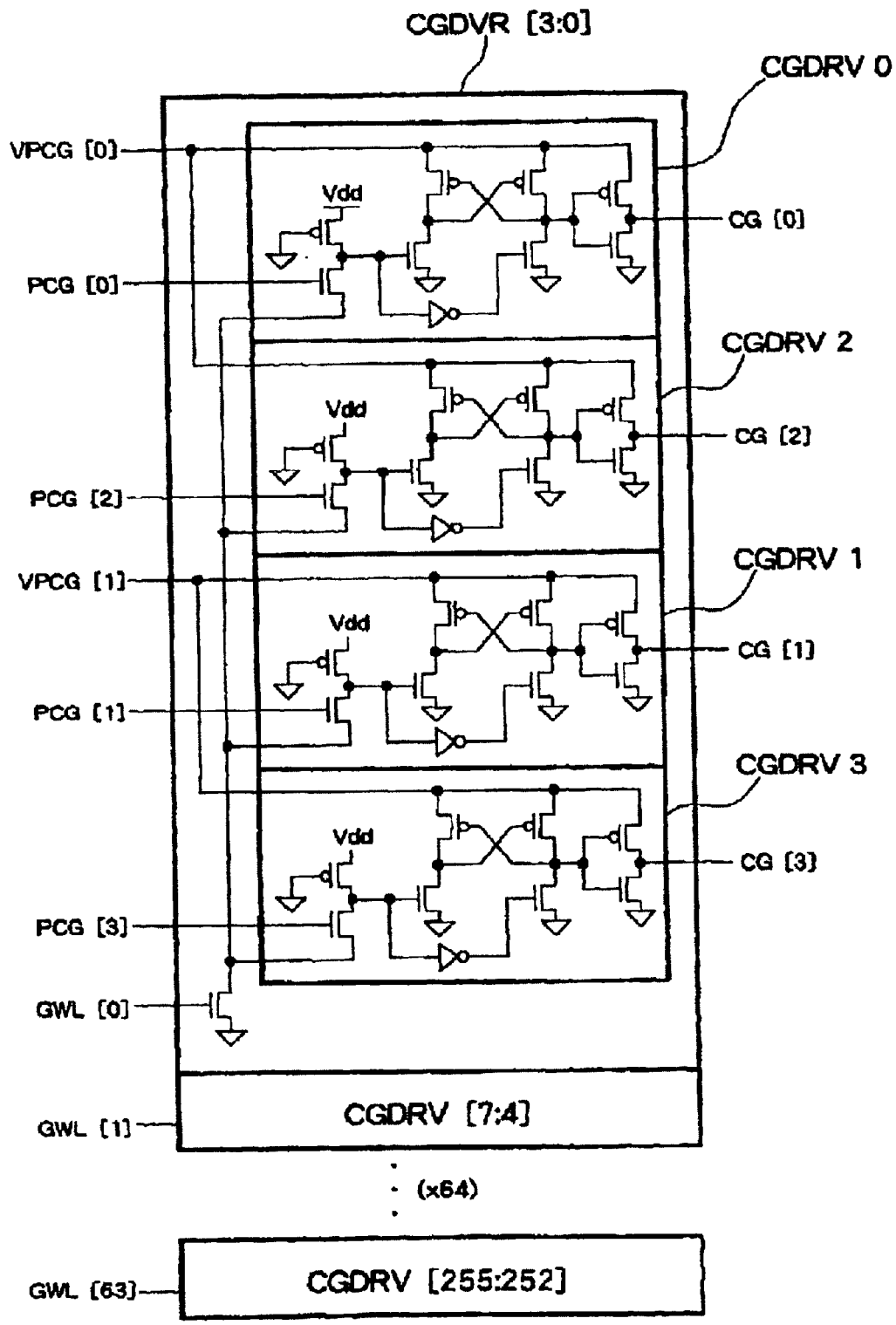
FIG. 9 is a circuit diagram showing an example of a control gate line driver CGDRV of FIG. 7.

FIG. 9 shows the control gate line drivers CGDRV [3:0] to CGDRV [255:252] provided corresponding to the small blocks 0 to 63 in the sector 0.

In FIG. 9, the control gate high voltage VPCG [0] is input to the control gate line drivers CGDRV 0 and 2, and the control gate high voltage VPCG [1] is input to the control gate line drivers CGDRV 1 and 3.

The driver select signals PCG [3:0] are input to the corresponding control gate line drivers CGDRV 0 to 3.

Taking the control gate line driver CGDRV 0 as an example, the control gate high voltage VPCG [0] at either VP1 or VP2 is output from the control gate line driver CGDRV 0 only in the case where a global word line signal GWL [0] is HIGH and the driver select signal PCG [0] is HIGH. In other cases, the output of the control gate line driver CGDRV 0 is 0 V. This operation also applies to other control gate line drivers.

Two precontrol gate negative voltage supply circuits VNCG provided corresponding to the sectors 0 and 1 supply a negative voltage VNCG (−3 V, for example), which is applied to the control gate when erasing data, to four control gate line drivers CGDRV 0 to 3 provided corresponding to each small block 215 in the sectors 0 and 1 based on the predecoded output from the predecoder 400.

In FIG. 9, a circuit which supplies the negative voltage VNCG when erasing data is omitted. However, data can be collectively erased in each sector by supplying the negative voltage VNCG to the control gates in all the small blocks 215 in the sector.

A two-sector control circuit SEC2CTL provided in common to the sectors 0 and 1 outputs signals XA [7:0], XB [3:0], and XB [7:4] which select the word line drivers WLDRV provided corresponding to each small block 215 in the sectors 0 and 1, and outputs a voltage VPBS [1:0] which drives the bit line select driver BSDRV.

The signal XA [7:0] which selects the word line driver selects one word line driver WLDRV in each small block 215 in the sectors 0 and 1 by which the word line is shared by using an 8-bit signal corresponding to the address signal A [2:0]. The select signal XB [7:0] corresponds to an address signal A [5:3]. Eight word line drivers WLDRV connected with the even-numbered word lines WL are selected from 64 word line drivers WLDRV [63-0] corresponding to one small block 215 by using the 4-bit select signal XB [3:0]. Eight word line drivers WLDRV connected with the odd-numbered word lines WL are selected from 64 word line drivers WLDRV [63-0] corresponding to one small block 215 by using the 4-bit select signal XB [7:4].

Figure 10:
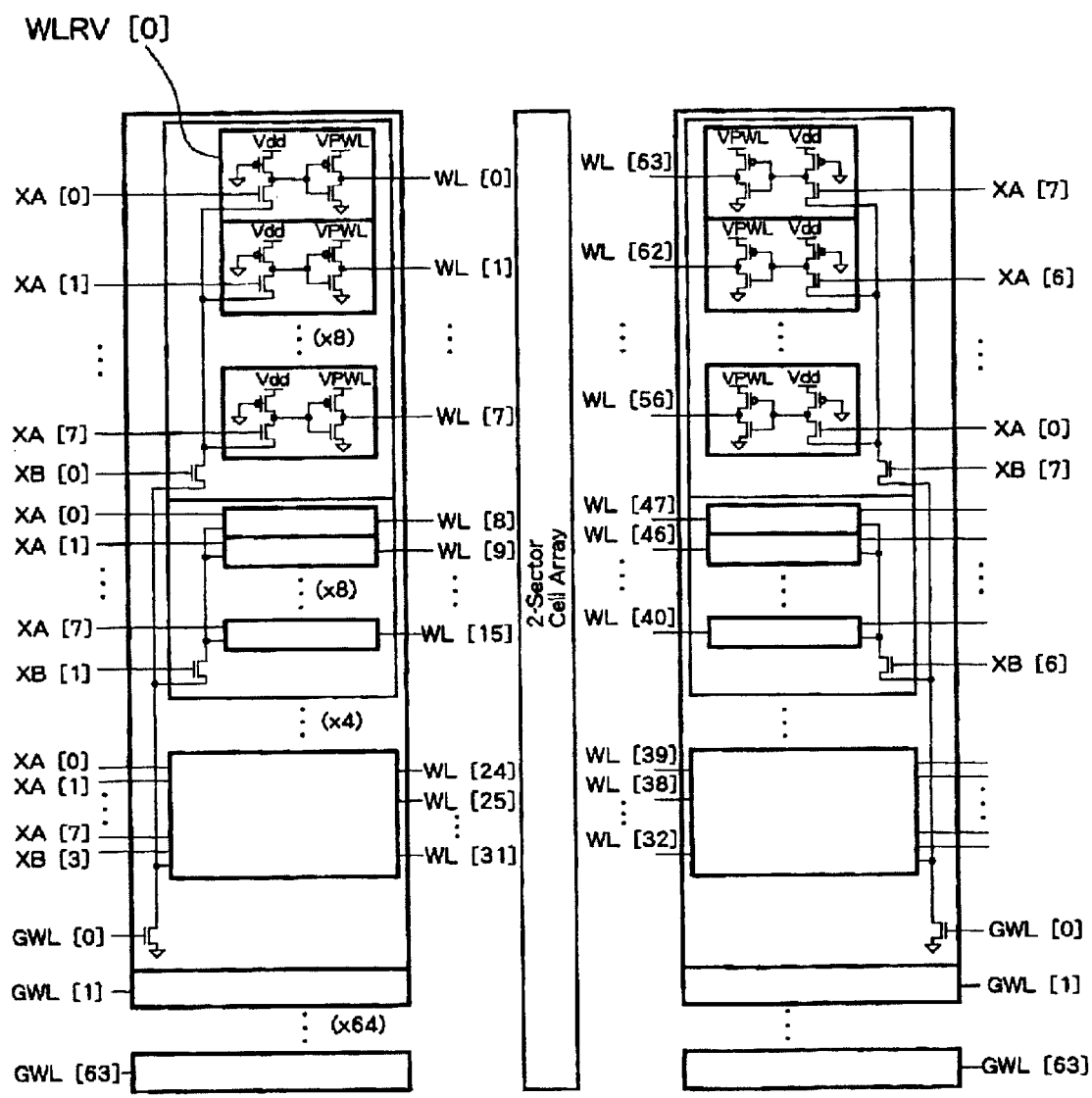
FIG. 10 is a circuit diagram showing an example of a word line driver WLDRV shown in FIG. 7.

Taking the word line driver WLDRV [0] shown in FIG. 10 as an example, the word line driver WLDRV [0] supplies a potential VPWL to the word line WL [0] when GWL [0], XA [0], and XB [0] all become ACTIVE. The word line driver WLDRV [0] supplies a ground potential in other cases. The potential VPWL is a write potential when writing data and is a read potential when reading data.

A bit line select high voltage VPBS [1:0] output from the two-sector control circuit SEC2CTL is described below.

Figure 11:
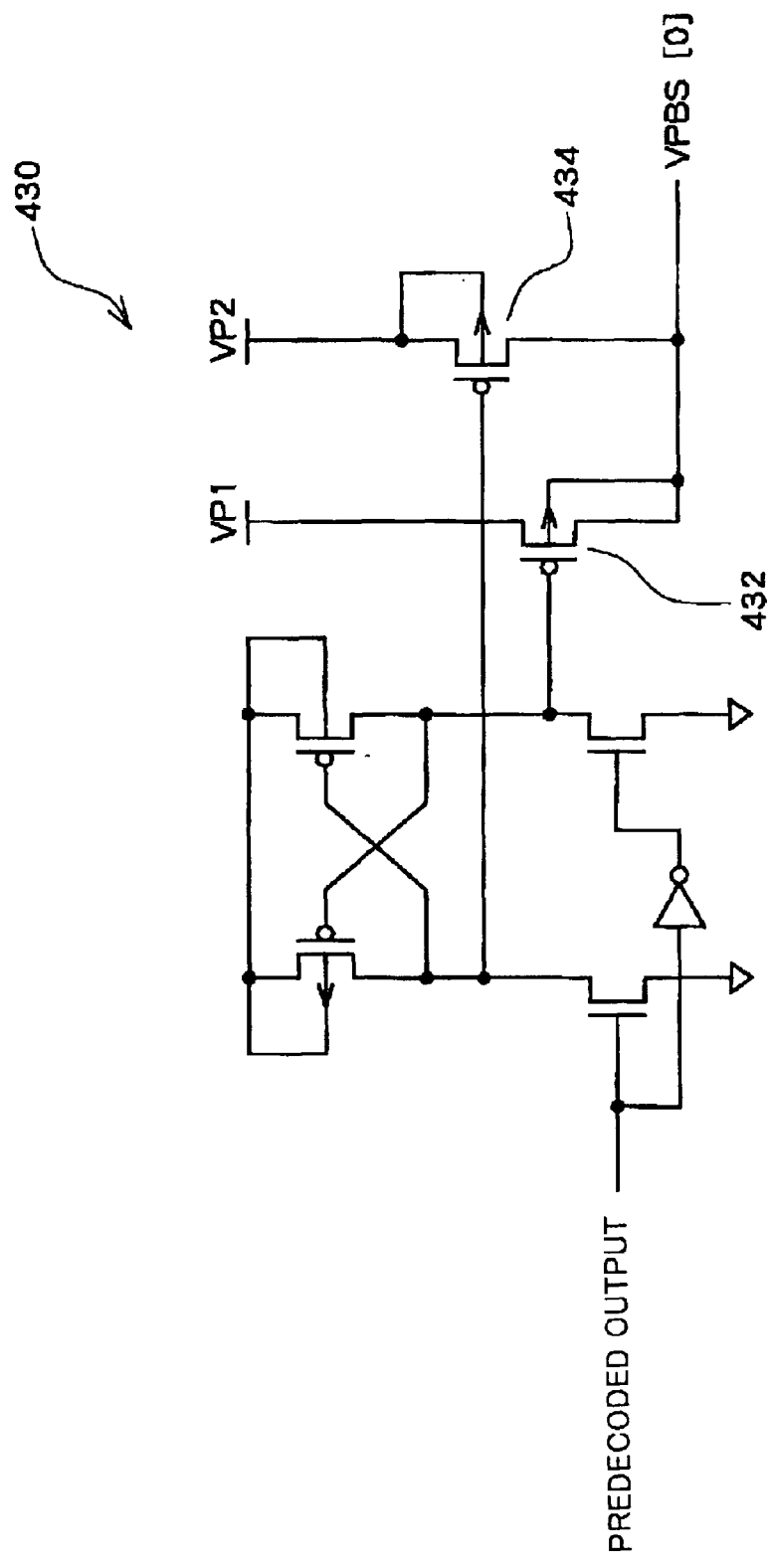
FIG. 11 is a circuit diagram showing an example of a bit line select voltage control circuit in a two-sector control circuit SEC2CTL of FIG. 7.

As shown in FIG. 11, the two-sector control circuit SEC2CTL includes a bit line select voltage control circuit 430 having a configuration similar to that of the control gate voltage control circuit EOCTL shown in FIG. 8.

FIG. 11 shows an example of the bit line select voltage control circuit 430 which outputs the bit line select high voltage VPBS [0]. In FIG. 11, if the predecoded output is HIGH, a P-type MOS transistor 432 is turned OFF and a P-type MOS transistor 434 is turned ON, whereby VP2 is output as the bit line select high voltage VPBS [0]. If the predecoded output is LOW, the P-type MOS transistor 432 is turned ON and the P-type MOS transistor 434 is turned OFF, whereby VP1 is output as the bit line select high voltage VPBS [0].

The voltages VP1 and VP2 are generated by the above-described charge-pump circuit corresponding to each mode. Specifically, VP1 and VP2 are respectively Vdd (1.5 V) and 4.5 V when reading data. VP1 and VP2 are 8 V when programming or erasing data, for example.

Figure 12:
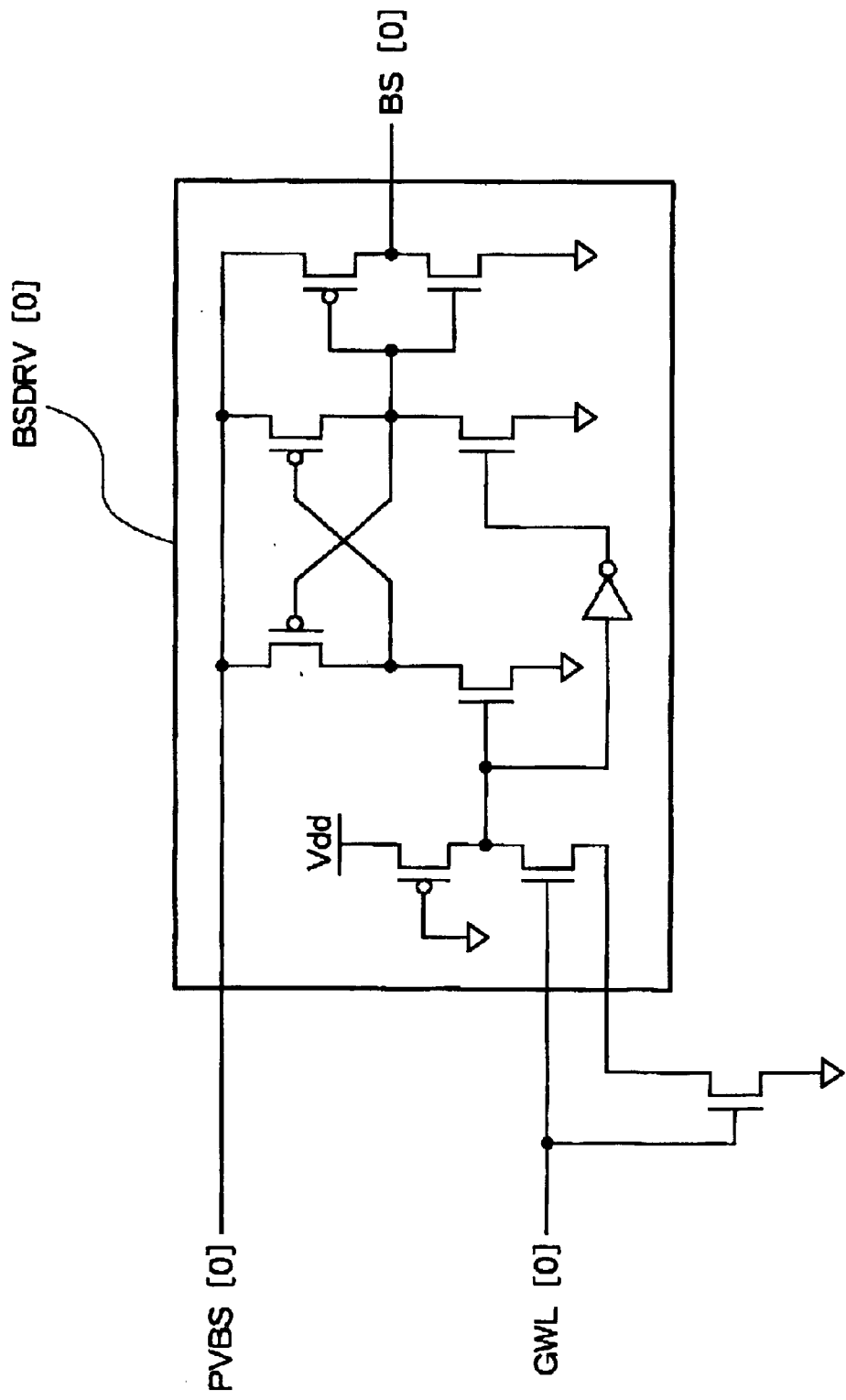
FIG. 12 is a circuit diagram showing an example of a bit line driver BSDRV [0] of FIG. 7.

FIG. 12 shows the bit line select driver BSDRV [0] provided corresponding to the small block 0 in the sector 0.

In FIG. 12, the bit line select high voltage VPBS [0] and the global word line signal GWL [0] are input to the bit line select driver BSDRV [0]. If the global word line signal GWL [0] is HIGH, the bit line select high voltage VPBS [0] at either VP1 or VP2 is output from the bit line select driver BSDRV [0]. In other cases, the output of the bit line select driver BSDRV [0] is 0V. This operation also applies to other bit line select drivers.

Operation

A data read operation, data program operation, and data erasing operation of the non-volatile semiconductor memory device of the present embodiment are described below.

Figure 13:
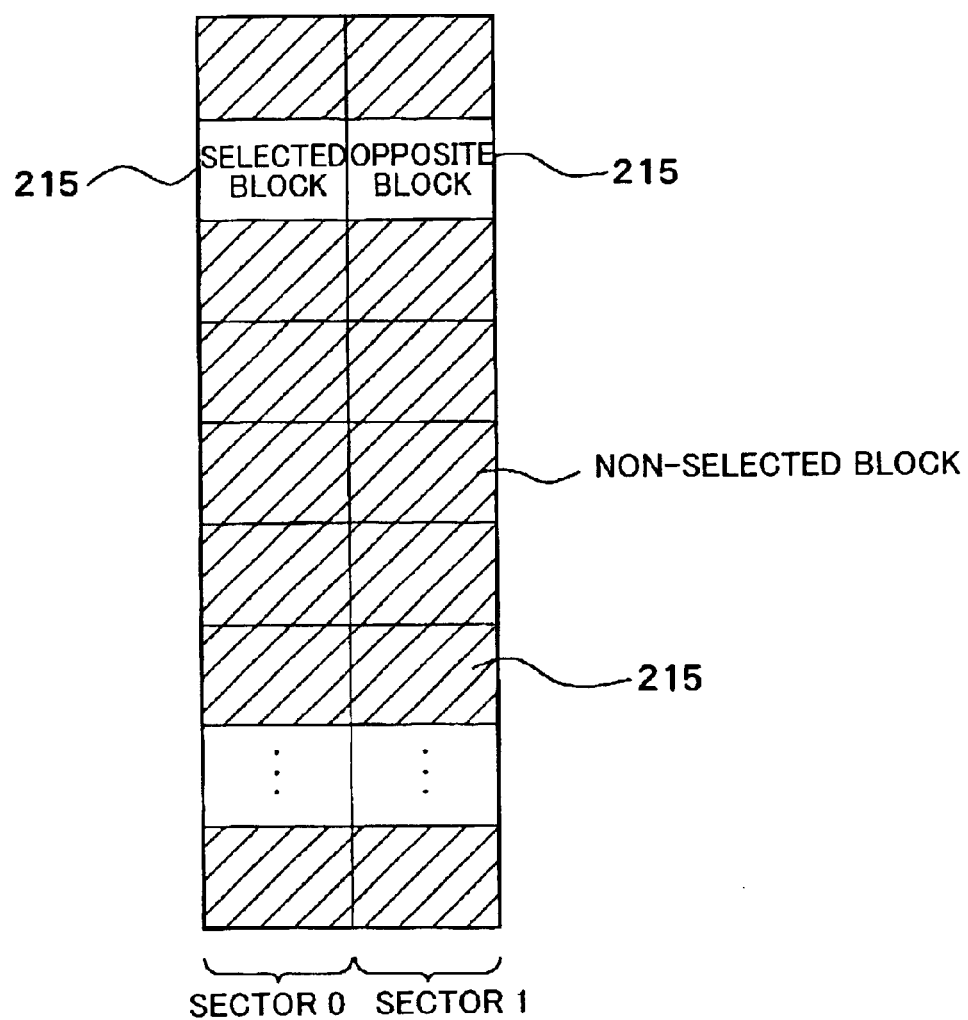
FIG. 13 is a view schematically showing a selected block, a non-selected opposite block, and other non-selected blocks.

The meaning of a "selected block", an "non-selected opposite block", and "non-selected blocks" used in the following description is given below. These terms are the names of the small blocks 215. Taking a pair of sectors 0 and 1 as an example, the selected block refers to one small block 215 selected in the sector 0, as shown in FIG. 13. The non-selected opposite block refers to the small block 215 adjacent to the selected block in the sector 1 adjacent to the sector 0. The non-selected blocks refer to all the small blocks 215 other than the selected block and the opposite block in the sectors 0 and 1 (including sectors 2 to 63).

When reading or programming data, a selected memory cell (selected memory cell 100) and a non-selected memory cell (non-selected memory cell 100) exist in the selected block. The memory element 108A or 108B in a selected cell and the memory element 108B or 108A in an opposite cell exist in the selected memory cell.

The potential of the control gate line CG, the bit line BL, and the word line WL when reading, programming, and erasing data is shown in Tables 2 and 3 based on the above definitions.

In the reverse read mode, data is read by sensing current flowing through the bit line BL [i] by using the bit line BL [i+1] connected with the selected cell 108B on the right of the memory cell 100 [i] as a source and the bit line BL [i] connected with the opposite cell 108A in the memory cell 100 [i] as a drain.

The present invention may also be applied to a forward read mode. In the forward read mode, data is read by sensing current flowing through the bit line BL [i+1] by using the bit line BL [i+1] connected with the selected cell 108B on the right of the memory cell 100 [i] as a drain and the bit line BL [i] connected with the opposite cell 108A in the memory cell 100 [i] as a source.

The read operation is described below taking the reverse read mode as an example. In this case, Vdd (1.5 V, for example) is applied to the word line WL1 in the same row as the memory cell 100 [i] as a read word line select voltage, thereby causing each transistor T2 in that row to be turned

TABLE 2

| | | Selected Block | | | | | | | |
|---|---|---|---|---|---|---|---|---|---|
| | | Selected Twin MONOS Cell | | | | | Non-selected Twin MONOS Cell | | |
| | | | Selected Cell | | Opposited Cell | | | | |
| Mode | BS | WL | BL | CG | BL | CG | WL | BL | CG |
| Read | 4.5 V (Opp. Side) Vdd (Sel. Side) | Vdd | 0 V | 1.5 V ± 0.1 V | sense | 3 V | Vdd or 0 V | sense or 0 V | 3 v or 1.5 V ± 0.1 V or 0 V |
| Program | 8 V | About 1 V | 5 V | 5.5 V | Iprg = 5 uA (0 to 1 V) | 2.5 V | About 1 V or 0 V | 5 V or Vdd or (0 to 1 V) | 5.5 V or 2.5 V or 0 V |
| Erase | 8 V | 0 V | 4.5 to 5 V | −1 to −3 V | | 4.5 to 5 V | −1 to −3 V | | |

TABLE 3

| | Opposite Block | | | | Non-selected Block | | | |
|---|---|---|---|---|---|---|---|---|
| Mode | BS | WL | BL | CG | BS | WL | BL | CG |
| Read | 4.5 V (Opp. Side) Vdd (Sel. Side) | Vdd or 0 V | 0 V | 0 V | 0 V | 0 V | F | 0 V |
| Program | 8 V | About 1 V or 0 V | 0 V | 0 V | 0 V | 0 V | F | 0 V |
| Erase | 8 V | 0 V | 0 V | 0 V | 0 V | 0 V | F | 0 V |

The operations in each mode are described below with reference to Tables 2 and 3.

Data Read from Memory Cell

Figure 14:
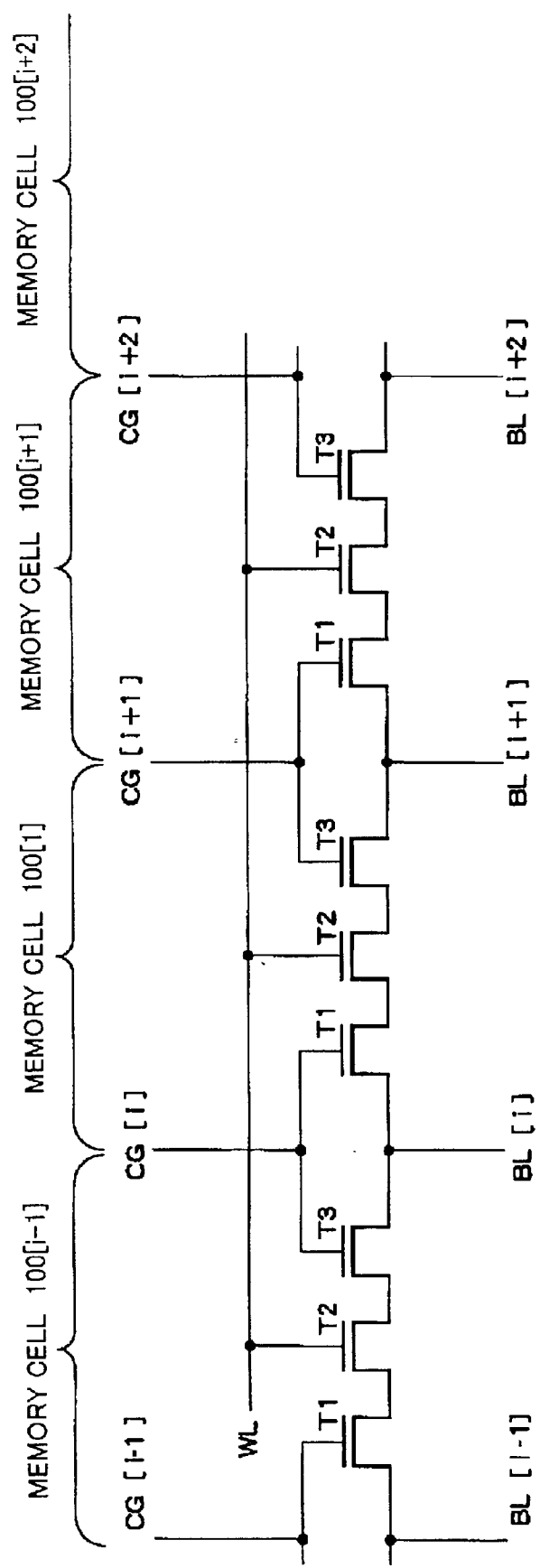
FIG. 14 is an equivalent circuit diagram of the memory cells shown in FIG. 1.

As shown in FIG. 14, a transistor T2 driven by the word gate 104, and transistors T1 and T3 respectively driven by the first and second control gates 106A and 106B are connected in series in one memory cell 100.

Figure 15:
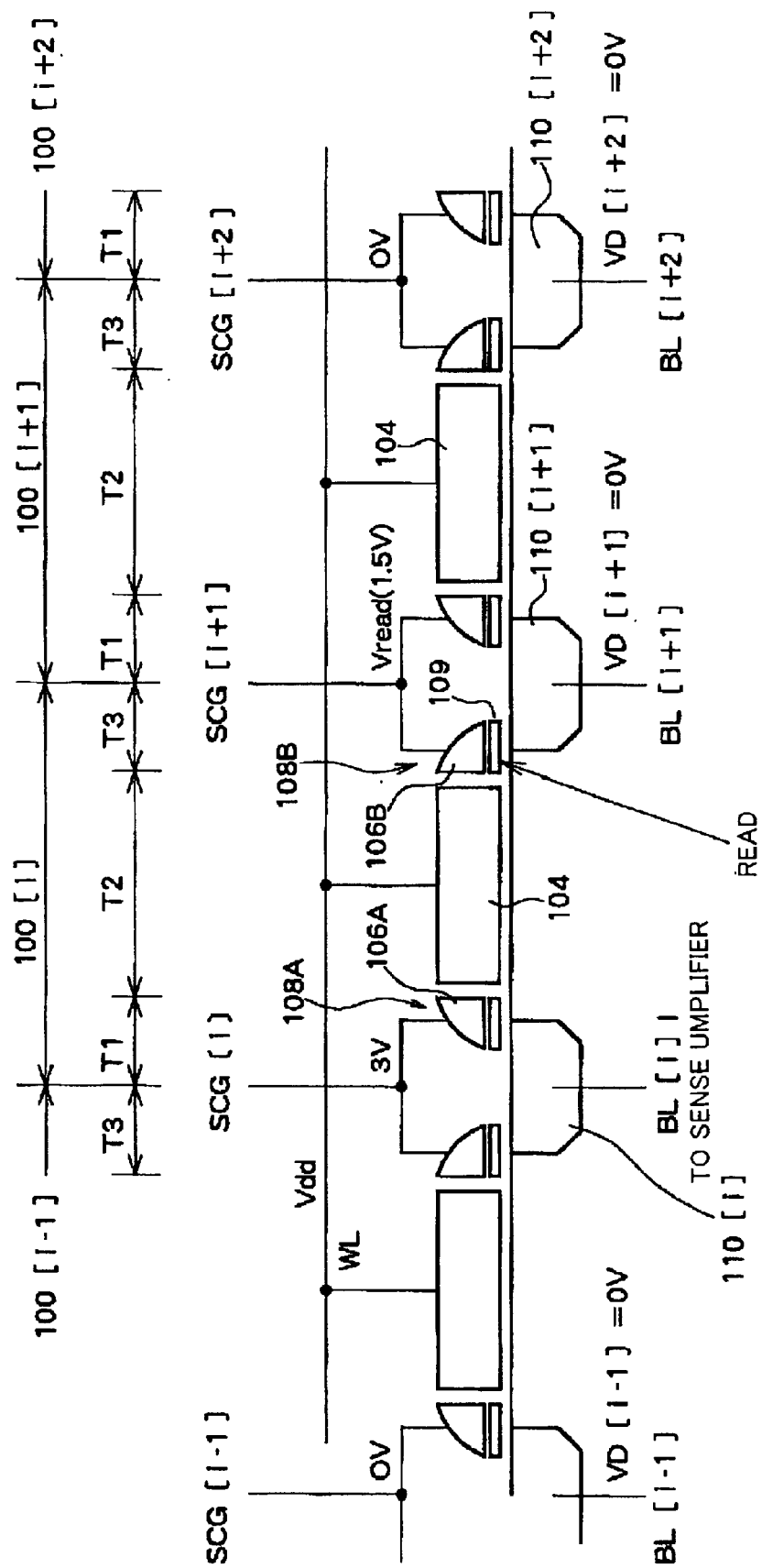
FIG. 15 is a diagram illustrative of a data read operation of the non-volatile semiconductor memory device shown in FIG. 1.
Figure 16:
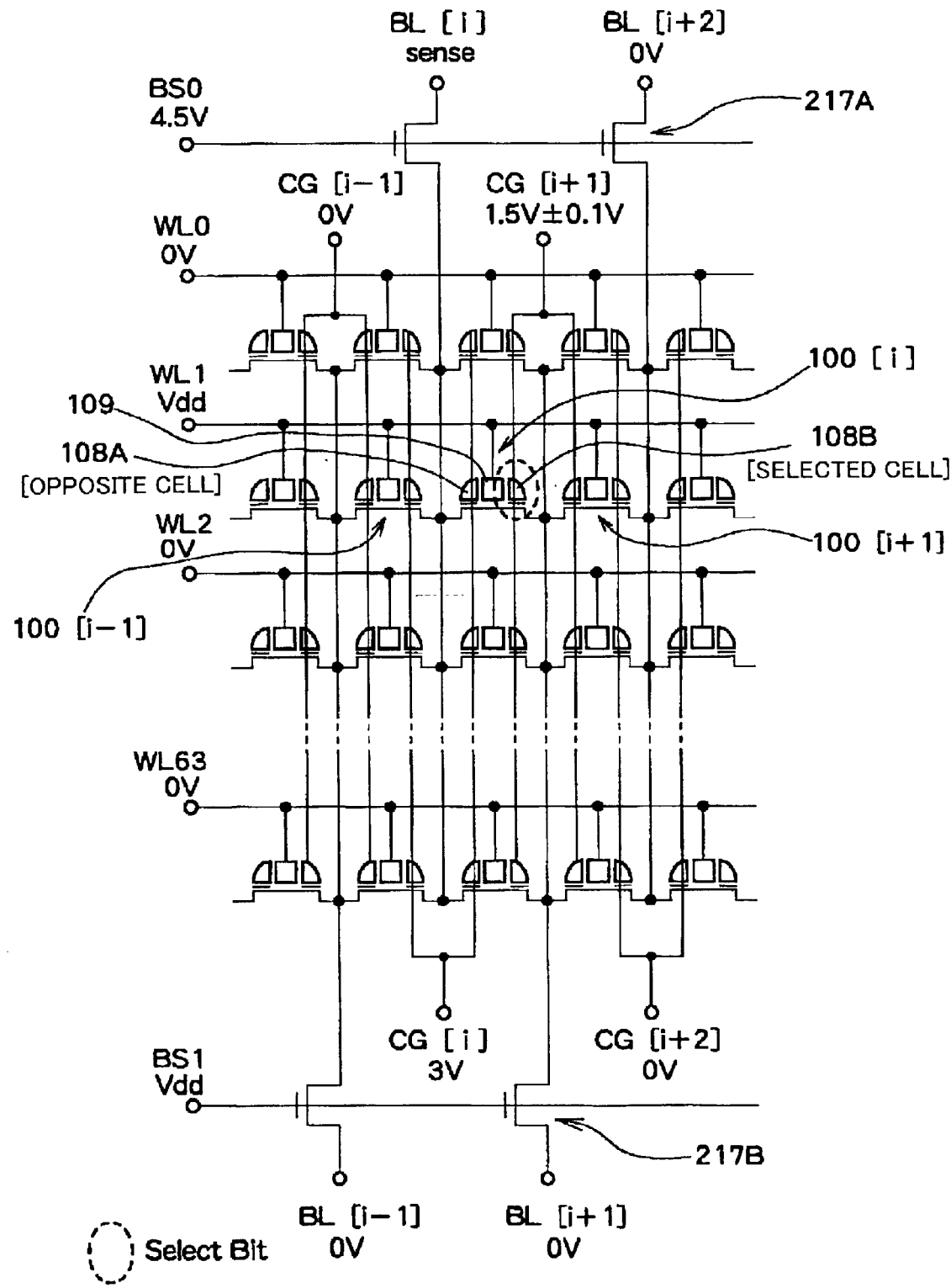
FIG. 16 is a diagram illustrative of the voltage setting in the selected block when reading data.

Before describing the operation of the memory cell 100, setting of the potential at each point of the adjacent four memory cells 100 [i−1], [i], [i+1], and [i+2] in one selected block (selected small block 215) in the sector 0 is described below with reference to FIG. 15. FIG. 15 is a view for describing the case of reading data from the MONOS memory element 108B (selected cell) on the right of the word gate 104 in the memory cell 100 [i] connected with the word line WL1 in a reverse read mode. FIG. 16 shows the voltage setting in the selected block when reading data.

ON. An override voltage (VP2 in FIG. 8=3 V, for example) is applied to the control gate 106A on the left of the memory cell 100 [i] (opposite cell) through the sub control gate line SCG [i], thereby causing the transistor T1 corresponding to the MONOS memory element 108A to be turned ON. A read voltage Vread (VP1 in FIG. 8=1.5 V, for example) is applied as a voltage VCG of the control gate 106B on the right of the memory cell 100 [i].

The operation of the transistor T3 corresponding to the MONOS memory element 108B differs as described below depending upon whether or not charges are stored in the MONOS memory element 108B (selected cell) on the right of the word gate 104.

Figure 17:
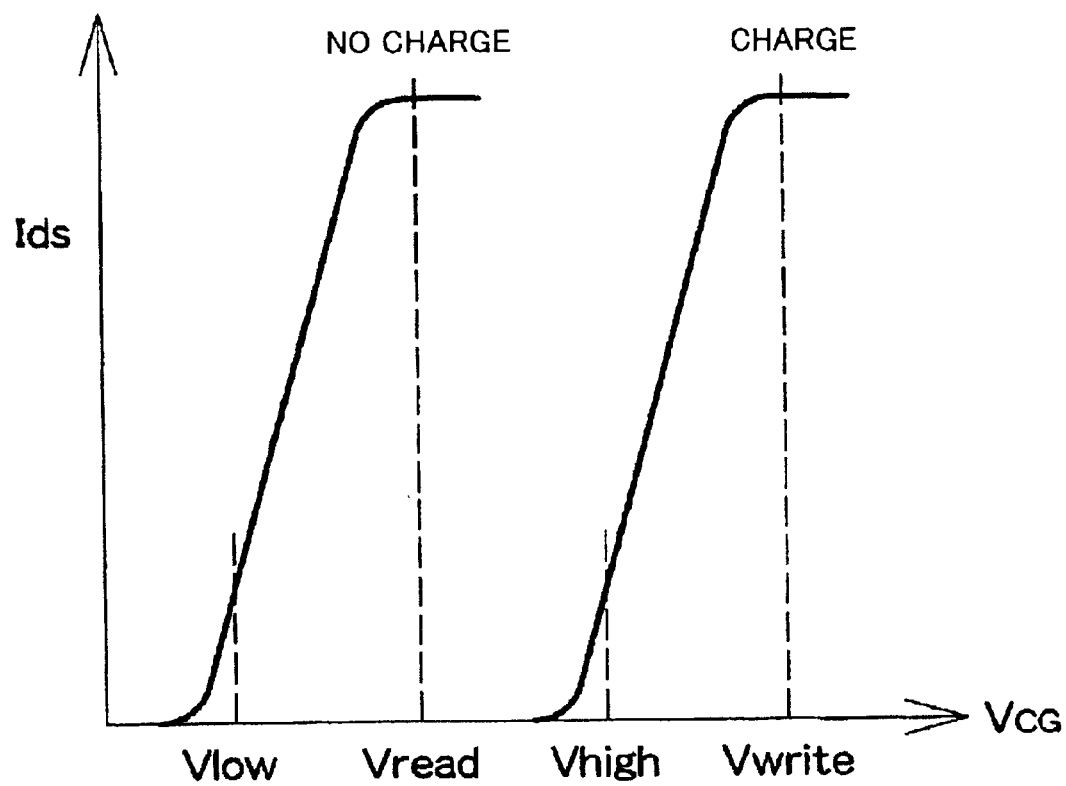
FIG. 17 is a characteristic chart showing the relationship between the control gate voltage VCG and the source-drain current Ids in the memory cells of FIG. 1.

FIG. 17 shows the relation between a voltage applied to the control gate 106B on the right (selected cell side) of the memory cell 100 [i] and a current Ids which flows between the source and drain of the transistor T3 corresponding to the MONOS memory element 108B (selected cell) controlled by this voltage.

As shown in FIG. 17, in the case where charges are not stored in the MONOS memory element 108B (selected cell), the current Ids starts to flow when the control gate voltage VCG exceeds a lower threshold voltage Vlow. In the case where charges are stored in the MONOS memory element 108B (selected cell), the current Ids does not start to flow unless the control gate potential VCG on the selected side exceeds a higher threshold voltage Vhigh.

The voltage Vread applied to the control gate 106B on the selected side when reading data is set at approximately an intermediate voltage between the threshold voltages Vlow and Vhigh.

Therefore, the current Ids flows when charges are not stored in the MONOS memory element 108B (selected cell), and the current Ids does not flow when charges are stored in the MONOS memory element 108B (selected cell).

When reading data, the bit line BL [i] (impurity layer 110 [i]) connected with the opposite cell is connected with a sense amplifier, and potentials VD [i−1], [i+1], and [i+2] of other bit lines BL [i−1], [i+1], and [i+2] are set at 0 V, as shown in FIG. 16. This allows the current Ids to flow when charges are not stored in the MONOS memory element 108B (selected cell), whereby a current of 25 μA or more flows through the bit line BL [i] on the opposite side through the transistors T1 and T2 in an ON state, for example. Since the current Ids does not flow when charges are stored in the MONOS memory element 108B (selected cell), current flowing through the bit line BL [i] connected with the opposite cell is less than 10 nA even if the transistors T1 and T2 are in an ON state, for example. Therefore, data can be read from the MONOS memory element 108B (selected cell) in the memory cell 100 [i] by detecting the current flowing through the bit line BL [i] on the opposite side by using the sense amplifier.

In the present embodiment, bit line select transistors (n-type MOS transistors) 217A are connected with the bit lines BL [i] and [i+2], and bit line select transistors 217B are connected with the bit lines BL [i−1] and [i+1], as shown in FIG. 16.

It is difficult to secure high current drive capability for these select transistors 217A and 217B with respect to the size of the transistors. In the present embodiment, the channel width W and the channel length L are respectively 0.9 μm and 0.8 μm, for example.

In order to secure the above current for the bit line BL [i] connected with the sense amplifier, a gate voltage BS0 of the bit line select transistor 217A is set at a high voltage of 4.5 V (=VP2) by using the circuit shown in FIG. 11, for example.

A voltage on the source side of the MONOS memory element 108A on the selected side shown in FIG. 16 is close to 0 V (about several tens to 100 mV). Therefore, effects of a back gate of the bit line select transistor 217B are small, whereby the gate voltage BS1 is set at Vdd (=VP1) by using a circuit similar to that shown in FIG. 11. Since it is unnecessary to supply 4.5 V to this gate, load applied to the charge-pump circuit (not shown) which generates a voltage of 4.5 V can be decreased.

In the case where the non-volatile memory element 108A on the left of the memory cell 100 [i] shown in FIG. 16 is selected, the bit line BL [i] becomes a source and the bit line BL [i+1] connected with the opposite cell 108B becomes a drain which is connected with the sense amplifier in the reverse read mode. In this case, the gate voltage BS0 of the bit line select transistor 217A is set at Vdd, and the gate voltage BS1 of the bit line select transistor 217B is set at 4.5 V.

The voltage setting of the non-selected cells in the selected block is as shown in Table 2.

Figure 18:
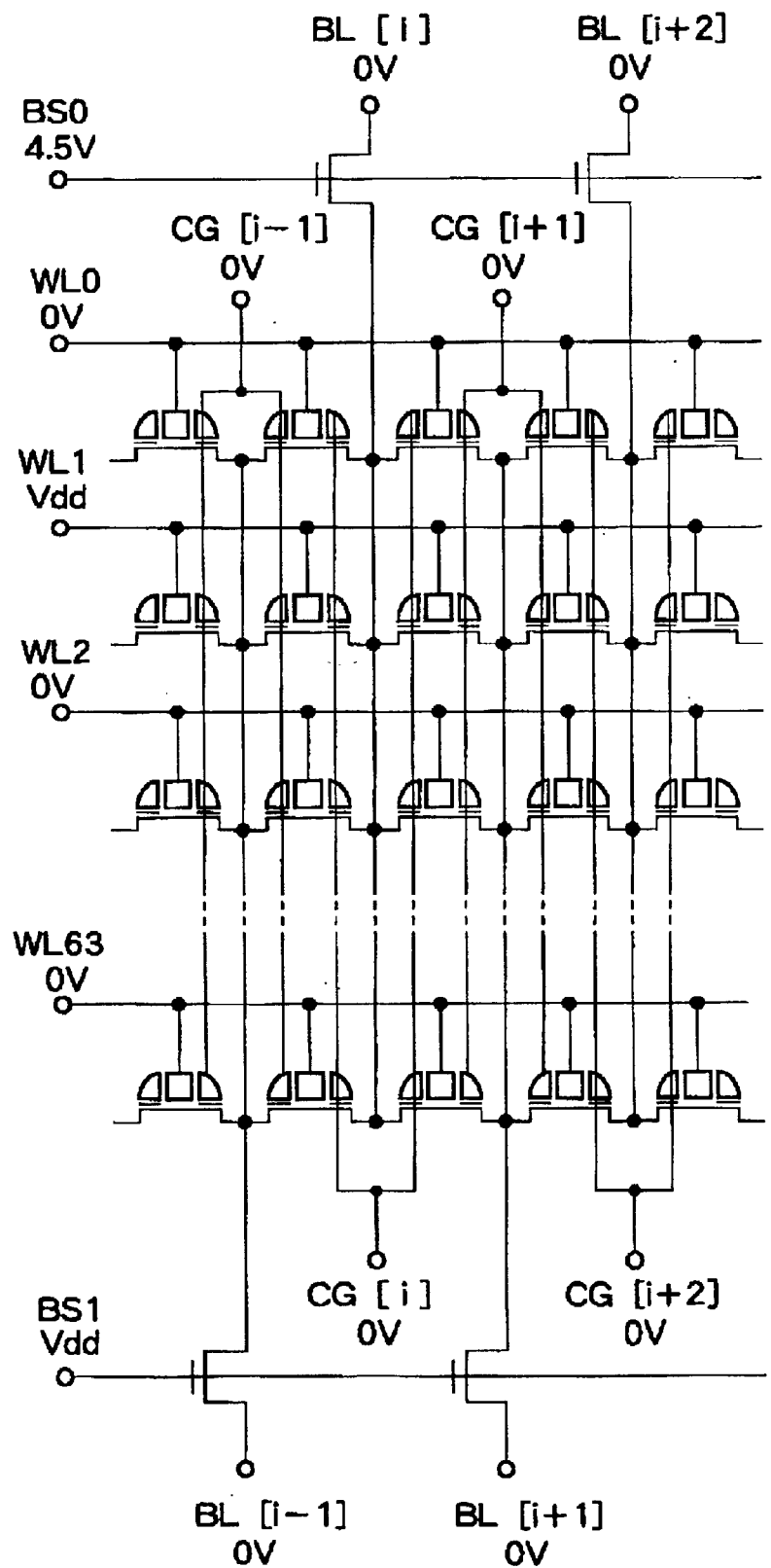
FIG. 18 is a diagram illustrative of the voltage setting in the non-selected opposite block when reading data.

The voltage setting of the opposite block (small block 215) in the sector 1 opposite to the selected block in the sector 0 is as shown in Table 3. The voltage setting is illustrated in FIG. 18. In FIG. 18, since the voltage of each word line WL and the gate voltage of the bit line select transistor are shared by the sectors 0 and 1, the voltage setting is the same as in the selected block shown in FIG. 16. All the bit lines are set at 0 V.

Figure 19:
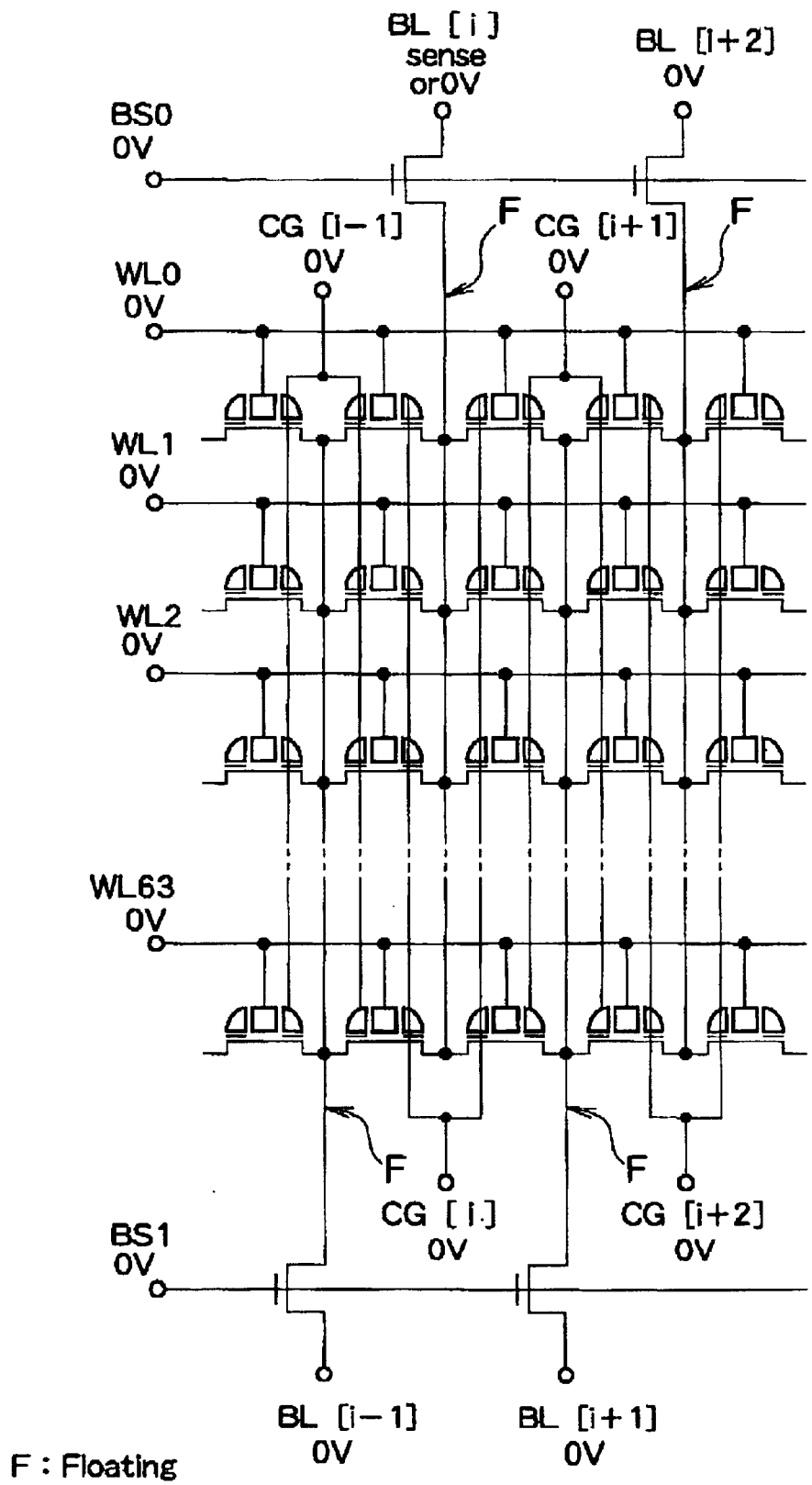
FIG. 19 is a diagram illustrative of the voltage setting in the non-selected blocks other than the opposite block when reading data.

The voltage setting of the non-selected blocks (small blocks 215) other than the selected block and the opposite block in the sectors 0 to 63 is as shown in Table 3. The voltage setting is illustrated in FIG. 19.

In the non-selected blocks, the gate voltage of the bit line select transistors 217A and 217B, the word lines WL, and the control gate lines CG are set at 0 V. Since the bit line select transistors 217A and 217B are turned OFF, the bit lines BL are in a floating state.

Memory Cell Programming

Figure 20:
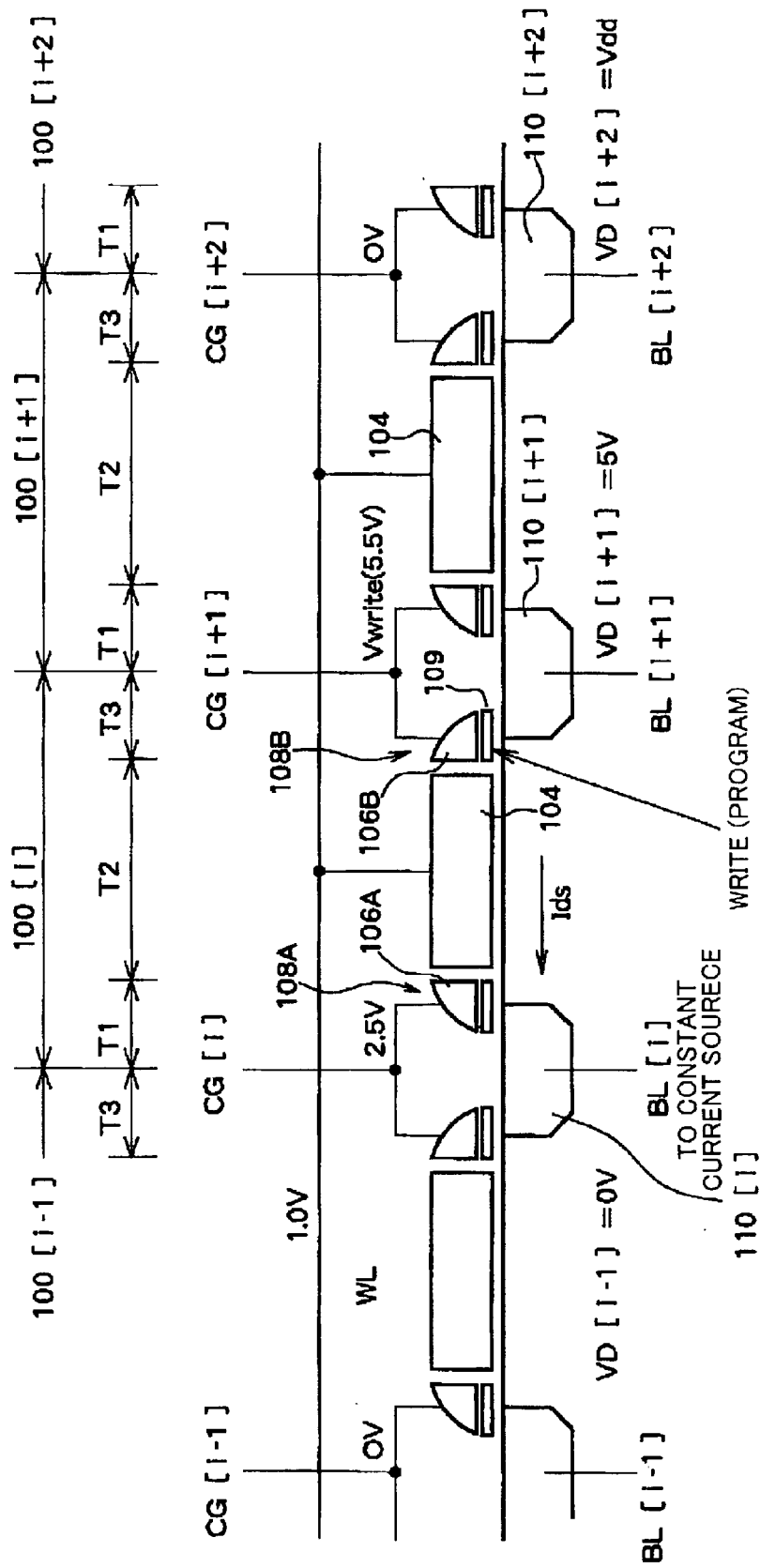
FIG. 20 is a diagram illustrative of a data write (program) operation of the non-volatile semiconductor memory device shown in FIG. 1.
Figure 21:
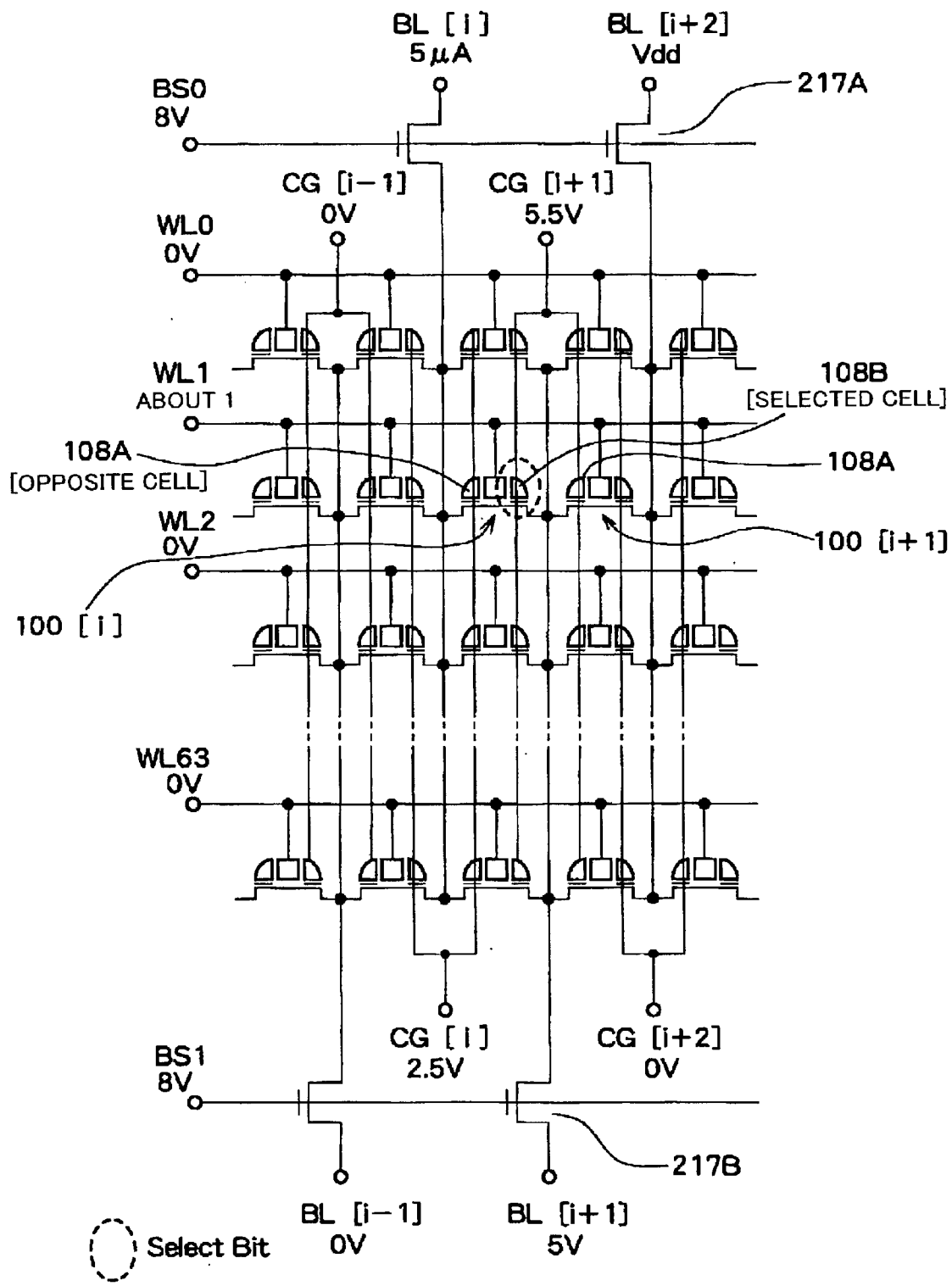
FIG. 21 is a diagram illustrative of the voltage setting in the selected block when programming data.

FIG. 20 is a view for describing programming of data in the MONOS memory element 108B (selected cell) on the right of the word gate 104 in the memory cell 100 [i] connected with the word line WL1. FIG. 21 shows the voltage setting in the selected block. A data erasing operation described later has been performed before the data programming operation.

In FIG. 20, the potential of the sub control gate line SCG [i] is set at the override potential (VP1 in FIG. 8=2.5 V, for example), and the potential of the sub control gate lines SCG [i−1] and [i+2] is set at 0 V in the same manner as in FIG. 15. The override potential is a potential necessary for allowing a program current to flow by causing the transistor T1 corresponding to the MONOS memory element 108A to be turned ON, irrespective of the presence or absence of a program in the MONOS memory element 108A (opposite cell opposite to the selected cell) on the left of the memory cell 100 [i]. The potential of each word gate 104 shown in FIG. 21 is set at a program word line select voltage lower than the power supply voltage Vdd (about 1.0 V, for example) by the word line WL1. The potential of the control gate 108B (selected cell) on the right of the memory cell 100 [i+1] is set at the write voltage Vwrite shown in FIG. 4, which is a program control gate voltage (VP2 in FIG. 8=5.5 V, for example), through the sub control gate line SCG [i+1].

Figure 22:
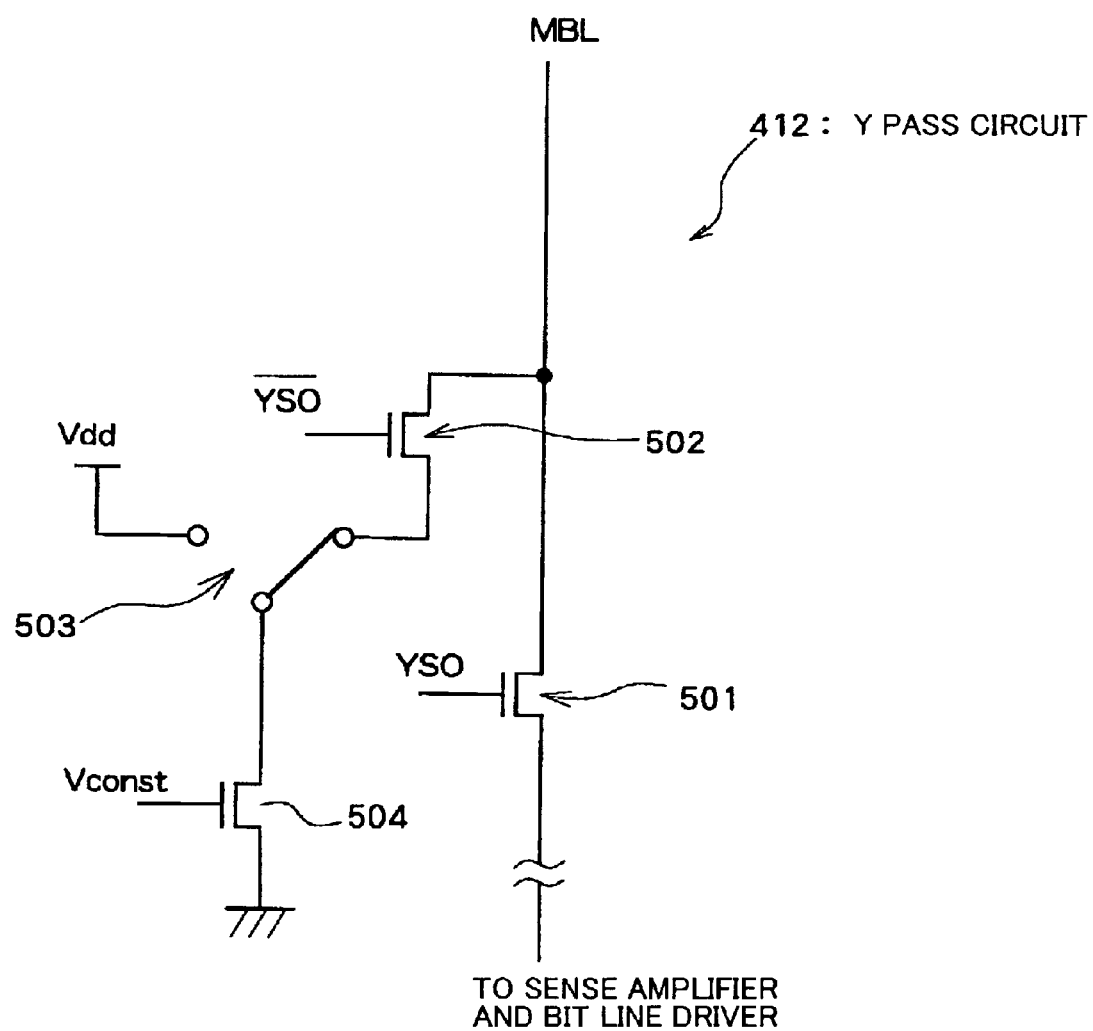
FIG. 22 is a circuit diagram schematically showing a Y-pass circuit connected to a bit line.

The voltage setting of the bit line BL is described below with reference to FIG. 22. FIG. 22 is a view schematically showing the inside of the Y-pass circuit 412 connected with the main bit line MBL.

A first transistor 501 for connecting the main bit line MBL with the sense amplifier or the bit line driver, and a second transistor 502 for connecting the main bit line MBL with another path are provided in the Y-pass circuit 412. Signals YS0 and /YS0 contrary to each other are input to gates of the first and second transistors 501 and 502.

A power supply voltage Vdd (1.8 V) through a switch 503 and a constant current source 504 which causes a constant current of 5 μA, for example, to flow are provided to a source of the second transistor 502.

When programming data, a voltage VD [i+1] of the bit line BL [i+1] shown in FIGS. 20 and 21 is connected with the bit line driver through the first transistor 501 shown in FIG. 22, and set at a bit line voltage for programming (5 V, for example).

The bit line BL [i+2] is set at Vdd through the second transistor 502 and the switch 503 shown in FIG. 22.

The bit lines BL [i−1] and [i] are connected with the constant current source 504 through the second transistor 502 and the switch 503 shown in FIG. 22. However, since the control gate line CG [i−1] is set at 0 V, the MONOS cell connected with the bit line BL [i−1] is turned OFF. Therefore, the MONOS cell is set at 0 V through the constant current source 504 due to the absence of current.

This causes the transistors T1 and T2 in the memory cell 100 [i] to be turned ON, whereby the current Ids flows toward the bit line BL [i]. At the same time, channel hot electrons (CHE) are trapped in the ONO film 109 of the MONOS memory element 108B. The program operation of the MONOS memory element 108B is performed in this manner, whereby data "0" or "1" is written in.

The bit line BL [i] may be set at 0 V by setting the program word line select voltage at about 0.77 V instead of about 1 V. In the present embodiment, current flowing into the bit line BL [i] when programming data is limited by the constant current source 504 while increasing the source-drain current by increasing the program word line select voltage to about 1 V. Therefore, the voltage of the bit line BL [i] can be set to an optimum value (0 to 1 V, about 0.7 V in the present embodiment), whereby the program operation can be suitably performed.

5.5 V is also applied to the control gate of the non-volatile memory element 108A on the left of the non-selected memory cell 100 [i+1] in the above operation. Since the control gate CG [i+2] on the right of the memory cell 100 [i+1] is set at 0 V, current should not flow between the source and drain (between bit lines) in the memory cell 100 [i+1]. However, since 5 V is applied to the bit line BL [i+1], a punch-through current flows when a high electric field is applied between the source and drain (between bit lines) of the memory cell 100 [i+1], whereby write disturbance occurs. Therefore, occurrence of write disturbance is prevented by decreasing the potential difference between the source and drain by setting the voltage of the bit line BL [i+2] at Vdd instead of 0 V, for example. The transistor T2 of the memory cell [i+1] is rarely turned ON by setting the voltage of the bit line BL [i+2] at more than 0 V, preferably equal to or more than the word line select voltage when programming. This also prevents the occurrence of write disturbance.

Since 5 V must be supplied to the bit line BL [i+1], VP1=VP2=8 V is applied to the gate of the bit line select transistor 217B by using a circuit similar to that shown in FIG. 11. 8 V (VP1=VP2=8V in FIG. 11) is also applied to the gate of the bit line select transistor 217A. Since the bit line BL [i+2] must be set at Vdd for the above-described reasons, a voltage higher than Vdd must be applied to the gate of the transistor 217A. Therefore, 8 V, which is the gate voltage of the transistor 217B, is used. The gate voltage of the bit line select transistor 217A is higher than Vdd+Vth.

The voltage setting of the non-selected cells in the selected block is as shown in Table 2.

Figure 23:
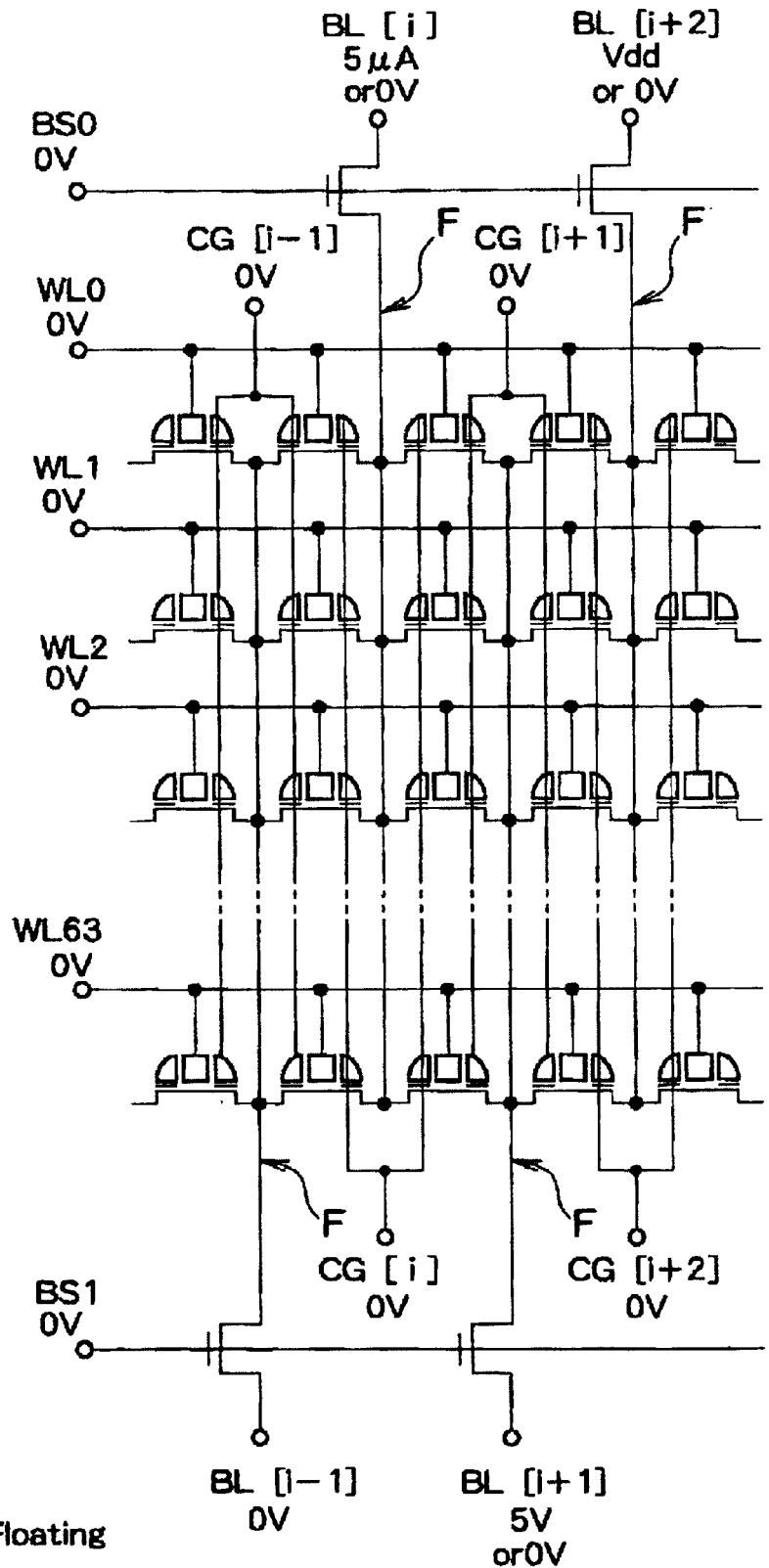
FIG. 23 is a diagram illustrative of the voltage setting in the non-selected opposite block when programming data.

The voltage setting of the opposite block (small block 215) in the sector 1 opposite to the selected block in the sector 0 is as shown in Table 3. The voltage setting is illustrated in FIG. 23. In FIG. 23, since the voltage of each word line WL and the gate voltage of the bit line select transistor is shared by the sectors 0 and 1, the voltage setting is the same as that in the selected block shown in FIG. 20. All the bit lines are set at 0 V.

Figure 24:
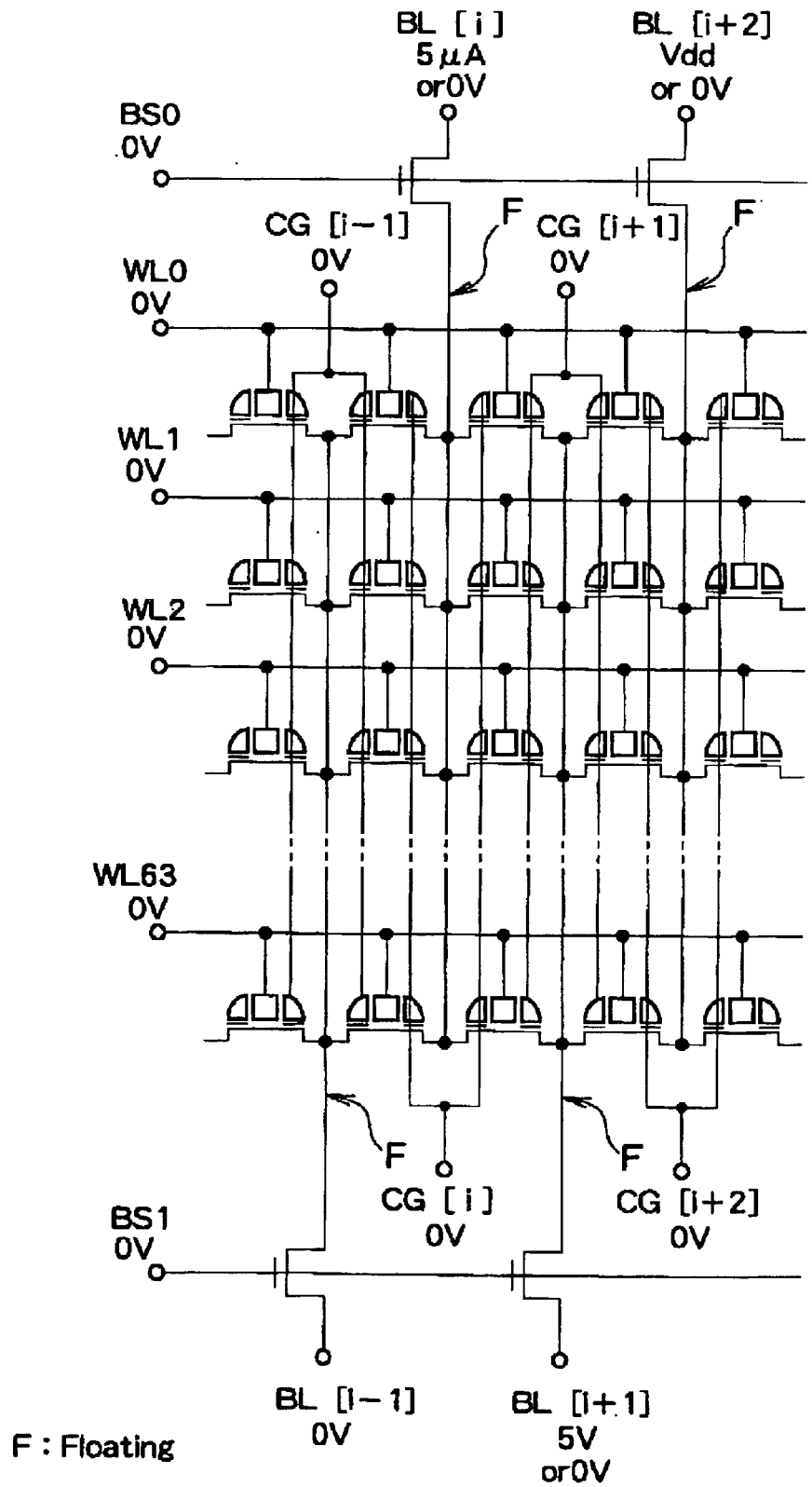
FIG. 24 is a diagram illustrative of the voltage setting in the non-selected blocks other than the opposite block when programming data.

The voltage setting of the non-selected blocks (small blocks 215) other than the selected block and the opposite block in the sectors 0 to 63 is as shown in Table 3. The voltage setting is illustrated in FIG. 24.

In the non-selected block, the gate voltage of the bit line select transistors 217A and 217B, the word lines WL, and the control gate lines CG are set at 0 V. Since the bit line select transistors 217A and 217B are turned OFF, the bit lines BL are in a floating state.

Figure 25:
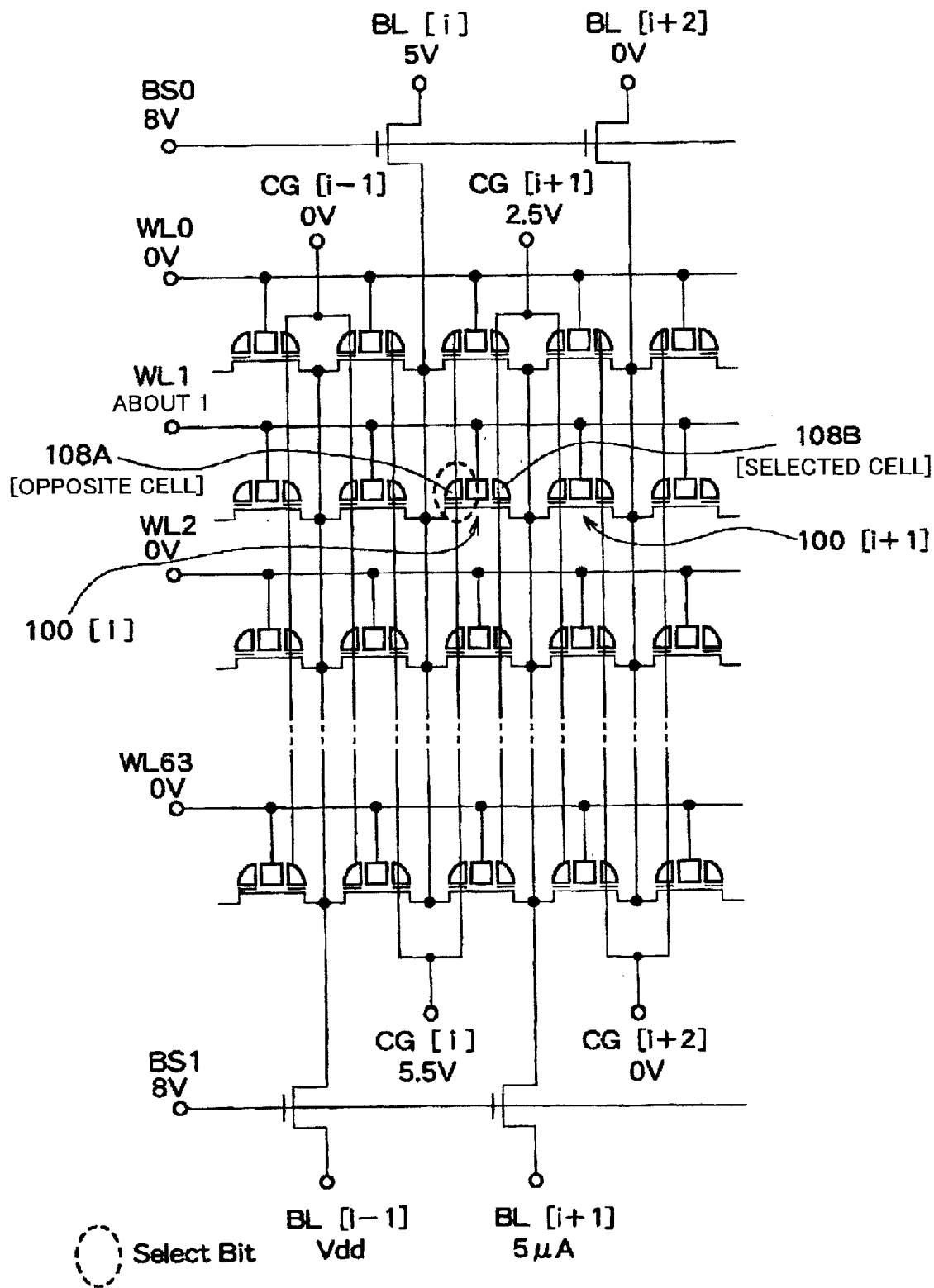
FIG. 25 is a diagram illustrative of the voltage setting in the selected block when programming data in a memory element opposite to that shown in FIG. 21.

In the case of programming the MONOS memory element 108A on the left of the memory cell 100 [i], the potential at each point of the memory cell 100 [i−1], [i], and [i+1] is set as shown in FIG. 25.

Memory Cell Data Erasure

Figure 26:
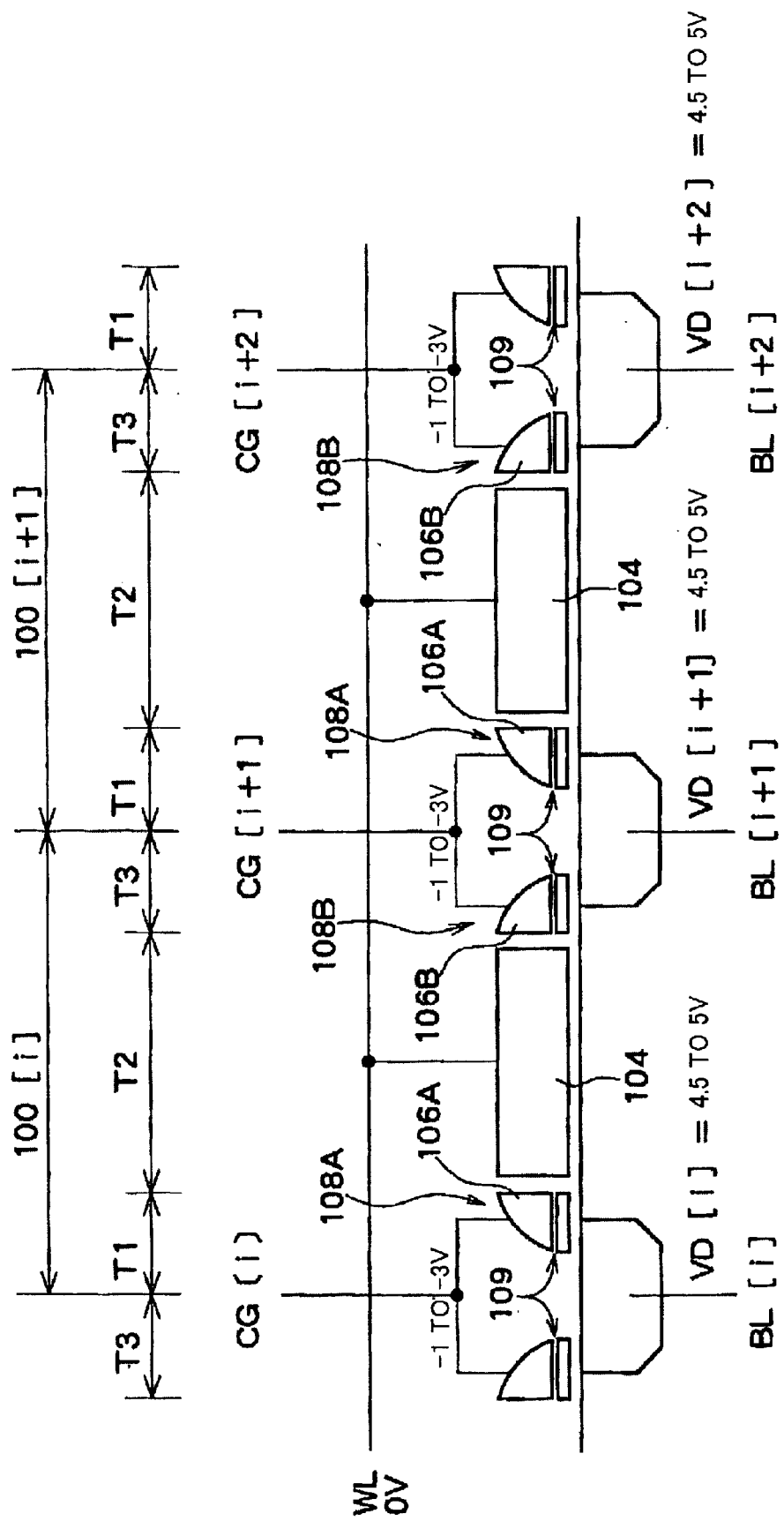
FIG. 26 is a diagram illustrative of a data erasing operation of the non-volatile semiconductor memory device shown in FIG. 1.
Figure 27:
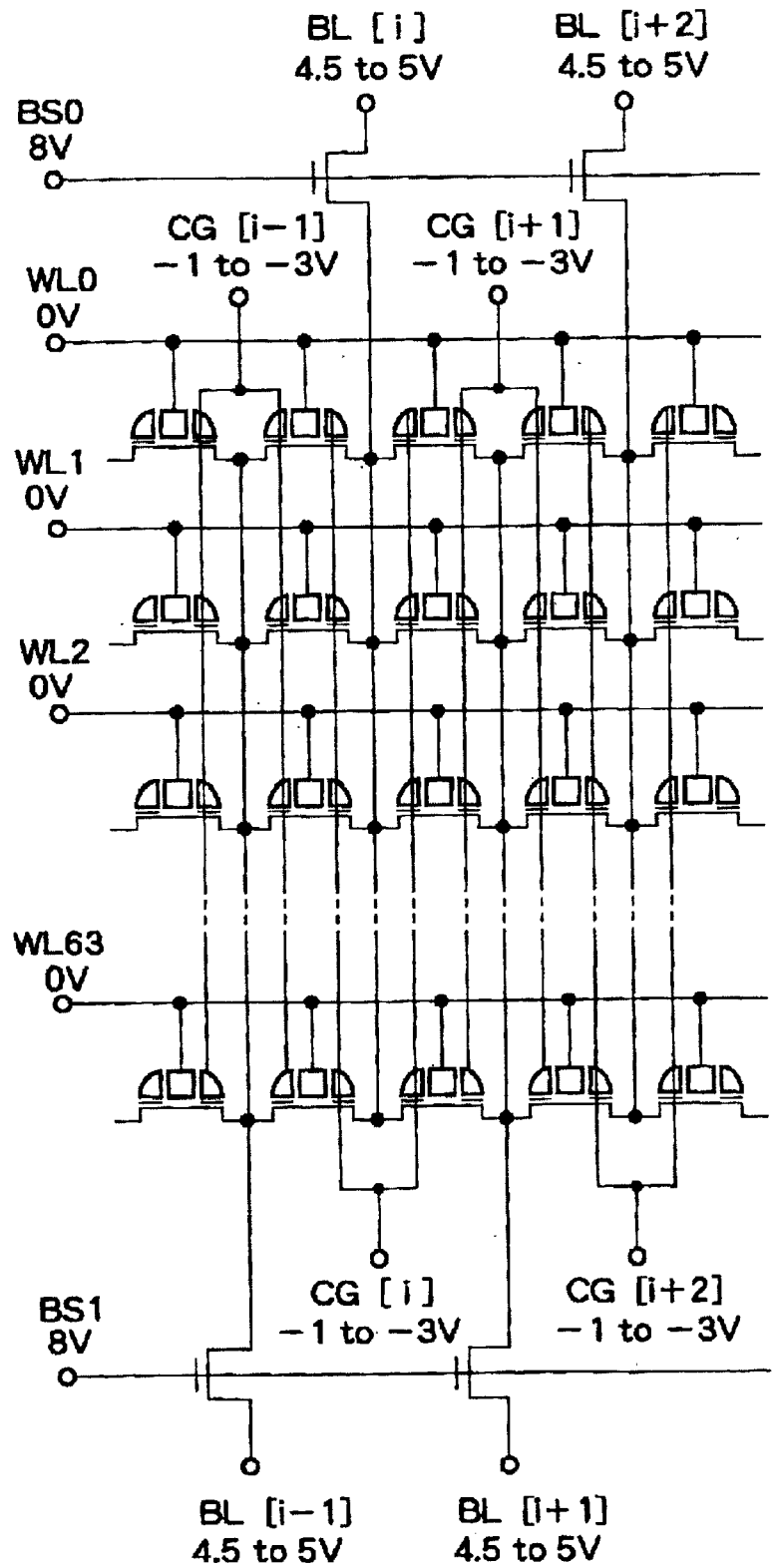
FIG. 27 is a diagram illustrative of the voltage setting in the selected block when erasing data.

FIG. 26 is an illustrative diagram for collectively erasing data in all the memory cells in the sector 0. FIG. 27 is a view showing the voltage setting of part of the memory cells in the sector 0.

In FIG. 26, the potential of each word gate 104 is set at 0 V by the word line WL. The potential of the control gates 106A and 106B is set at an erasure control gate line voltage VNCG of about −1 to −3 V, for example, by the sub control gate lines SCG [i−1], [i], [i+1], and [i+2]. The potential of the bit lines BL [i−1], [i], [i+1], and [i+2] is set at an erasing bit line voltage of 4.5 to 5 V, for example, by the bit line select transistors 217A and 217B and the bit line driver.

This causes electrons trapped in the ONO films 109 of the MONOS memory elements 108A and 108B to be extracted and erased by a tunnel effect caused by an electric field formed by the erasing control gate voltage applied to the control gate and the erasing bit line voltage applied to the bit line. This enables data to be erased in a plurality of memory cells at the same time. Differing from the above example, stored electrons may be erased by forming hot holes by band-band tunneling on the surface of the impurity layers which become the bit lines.

Instead of collectively erasing data in the sector, data may be erased by time division.

Figure 28:
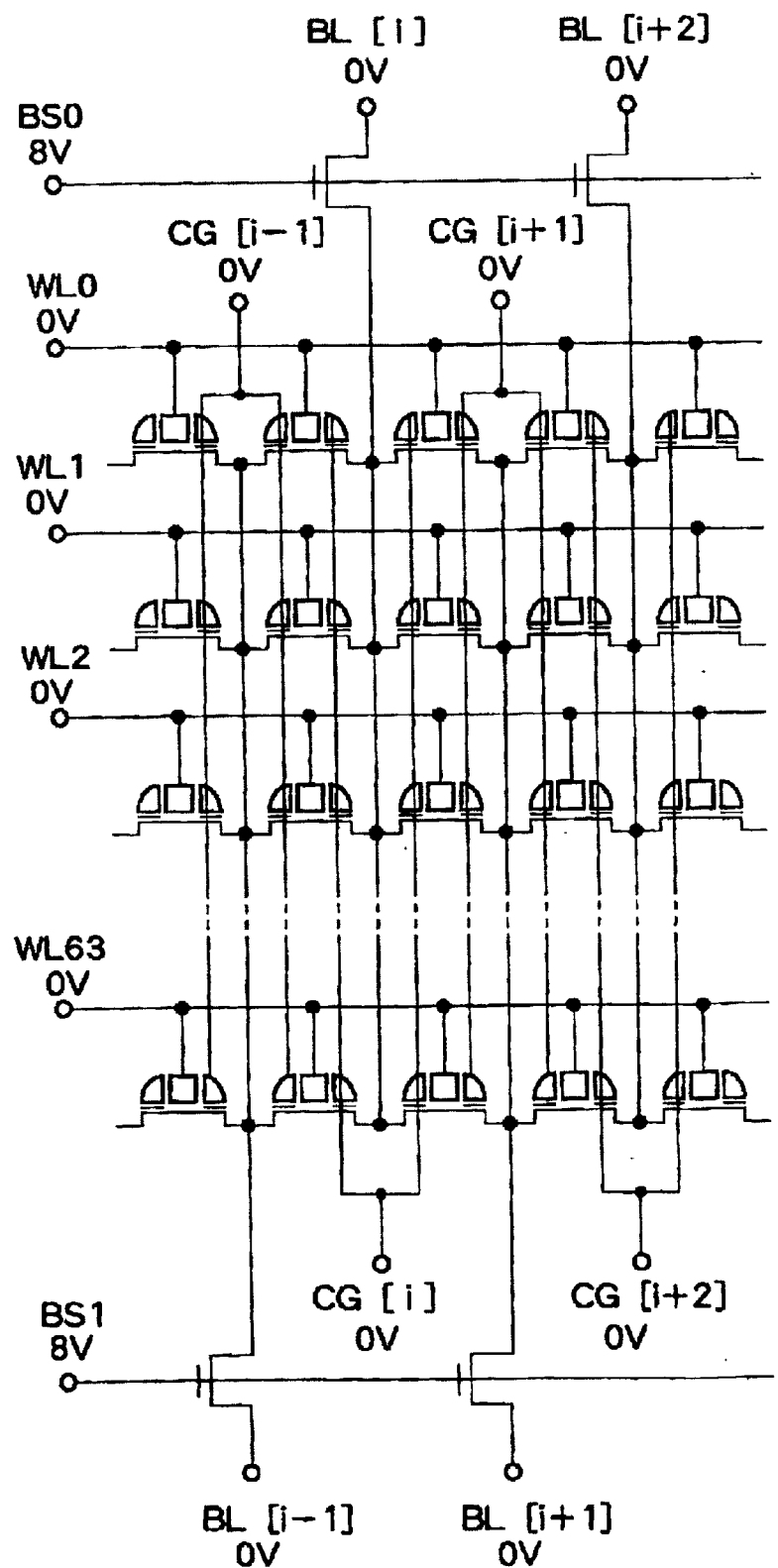
FIG. 28 is a diagram illustrative of the voltage setting in the non-selected opposite block when erasing data.

The voltage setting of the opposite block (small block 215) in the sector 1 opposite to the selected block in the sector 0 is as shown in Table 3. The voltage setting is illustrated in FIG. 28. In FIG. 28, since the voltage of each word line WL and the gate voltage of the bit line select transistor are shared by the sectors 0 and 1, the voltage setting is the same as in the selected block shown in FIG. 24. All the bit lines are set at 0 V. Since the control gate line CG and the bit line BL are set at 0 V in each cell in the opposite block, disturbance does not occur.

Figure 29:
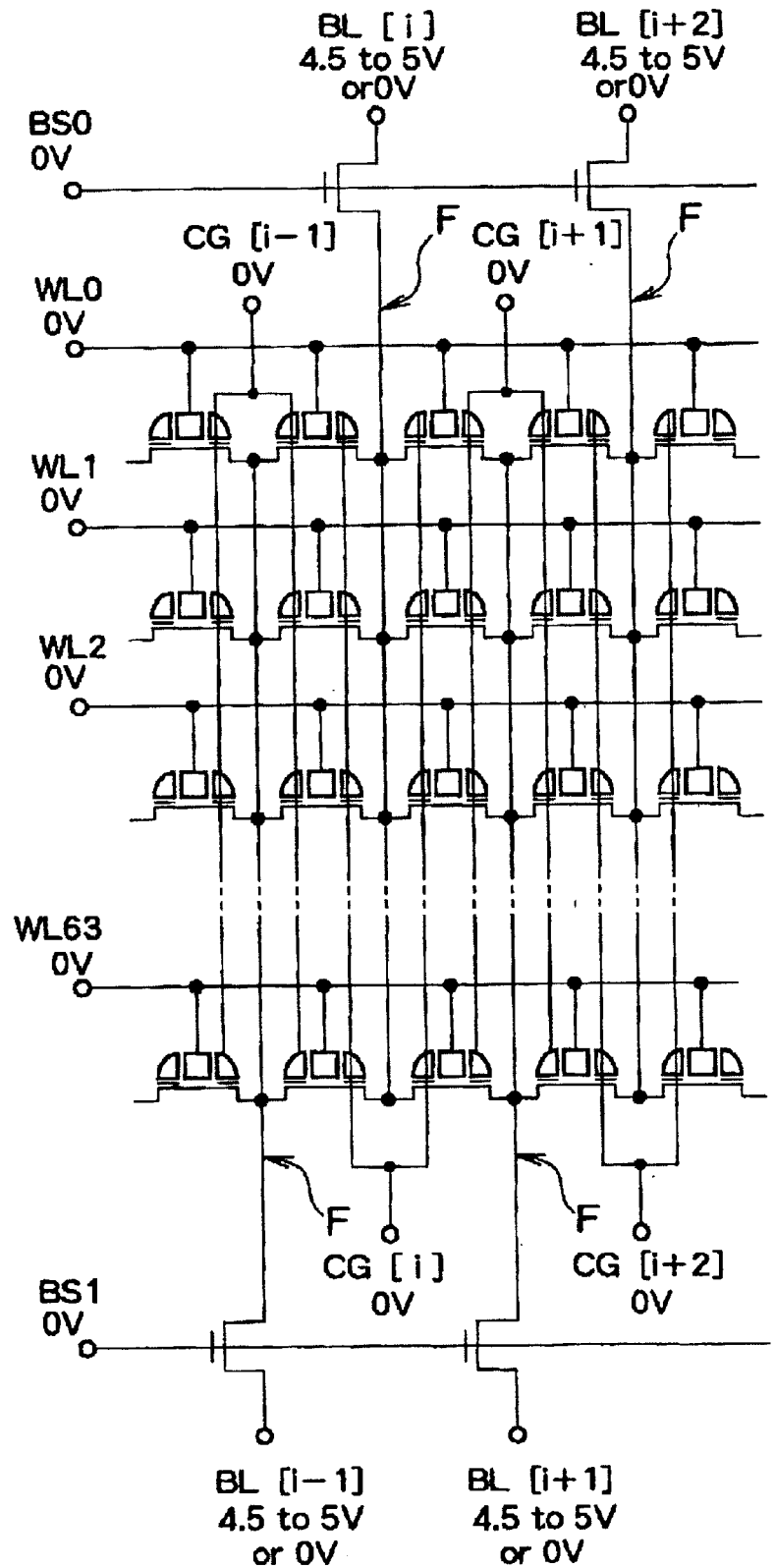
FIG. 29 is a diagram illustrative of the voltage setting in the non-selected blocks other than the opposite block when erasing data.

The voltage setting of the non-selected blocks (small blocks 215) other than the selected block and the opposite block in the sectors 0 to 63 is as shown in Table 3. The voltage setting is illustrated in FIG. 29.

In the non-selected blocks, the gate voltage of the bit line select transistors 217A and 217B, the word lines WL, and the control gate lines CG are set at 0 V. Since the bit line select transistors 217A and 217B are turned OFF, the bit lines BL are in a floating state. However, since the voltage of the bit line BL is about 0 V, disturbance does not occur in the cells in the non-selected blocks.

Y-Pass Circuit

Figure 7:
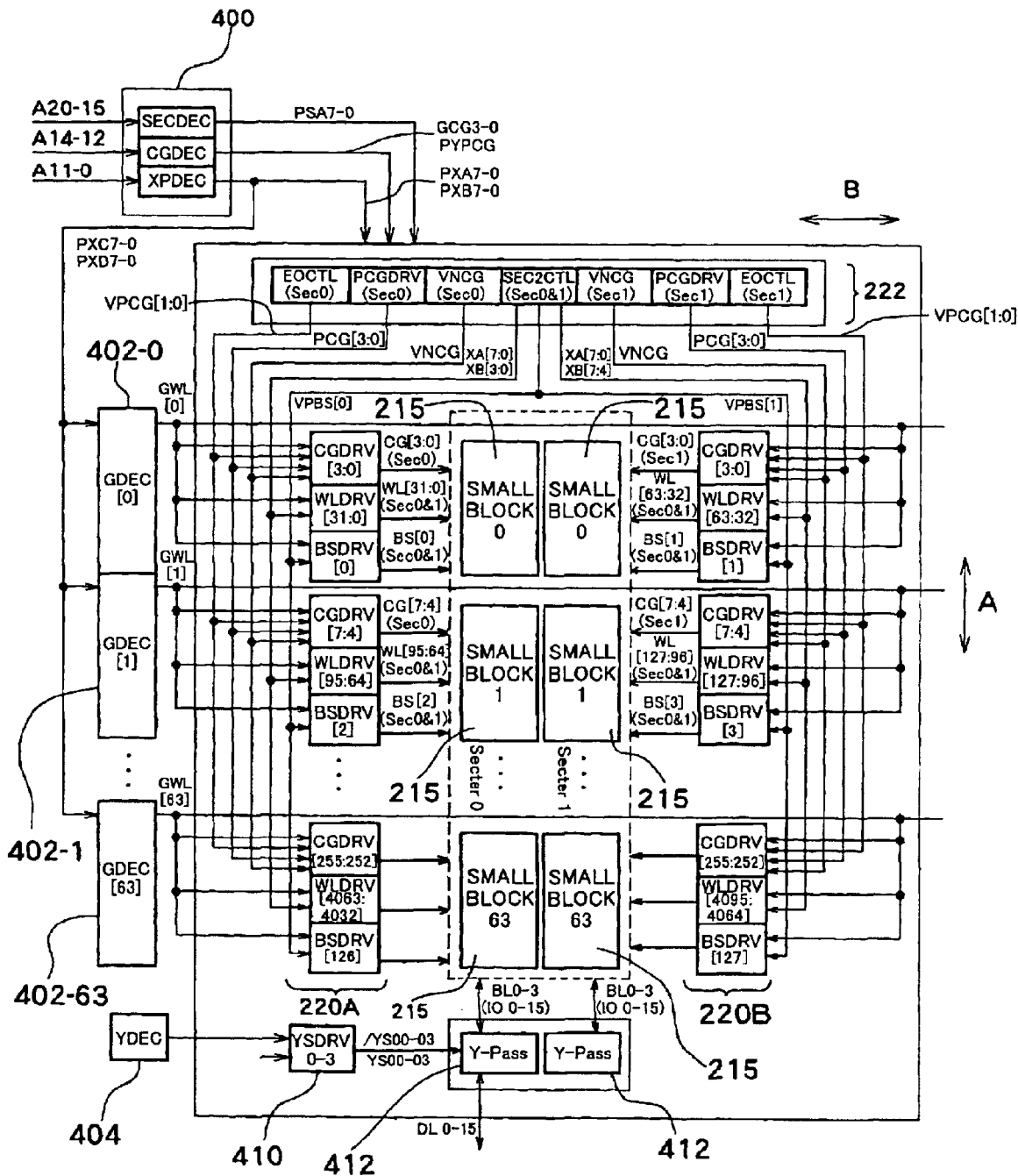
FIG. 7 is a block diagram showing peripheral driver circuits of two adjacent sectors.
Figure 30:
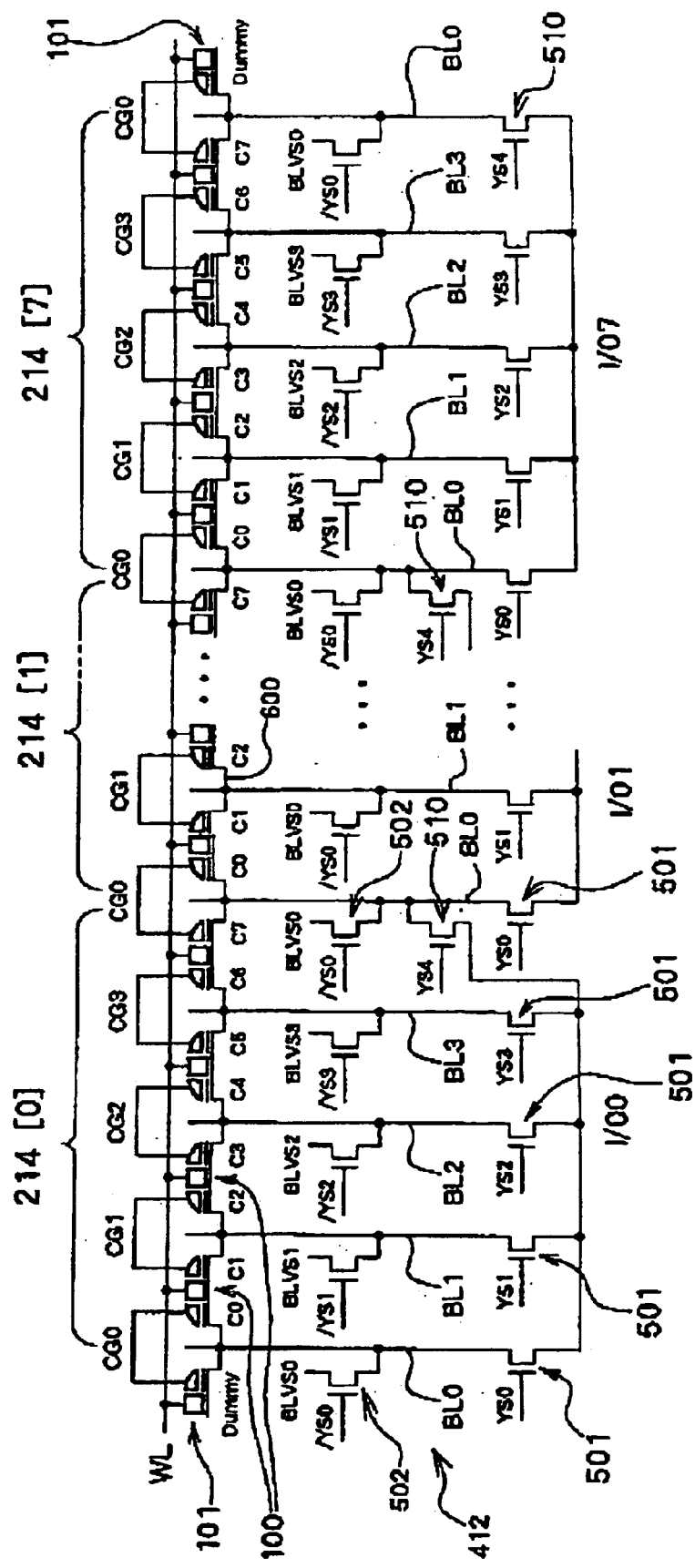
FIG. 30 is a circuit diagram showing an example of the Y-pass circuit of FIG. 7.

FIG. 30 is a view showing the Y-pass circuit 412 shown in FIG. 7. The Y-pass circuit 412 is provided in each sector. The block region 214 divided into memory blocks for I/O0 to I/O7 is disposed in one sector (see FIG. 2B).

Four memory cells 100 are connected in the row direction in each block region 214. The minimum number of memory cells 100 in one block region 214 is four. The memory cells 100 can be specified based on the decoded output if the number of memory cells 100 is $2^N$ (N is an integer of 2 or more).

Eight cells (non-volatile memory elements) provided in four memory cells 100 in one block region 214 are defined as cells C0 to C7, as shown in FIG. 30.

Dummy cells 101 having one of the first and second control gates 108A and 108B and the word gate are disposed on opposite ends of one sector region 214 in the row direction.

Each pair of memory cells 100 adjacent in the row direction is connected by a connect line 600. The bit line BL is connected with each of a plurality of connect lines 600. The bit lines BL disposed in one block region 214 are referred to as BL0 to BL3, as shown in FIG. 30. In the above-described embodiment, the sub bit line SBL is connected with the connect line 600, and the sub bit line SBL is connected with the main bit line MBL through the bit line select transistor. In FIG. 30, the sub bit line SBL and the main bit line MBL are collectively illustrated as the bit line BL.

One end of the transistor 501 is connected with each of the bit lines BL0 to BL3 in the same manner as in FIG. 22. The transistor 501 is hereinafter referred to as a first select gate. One of the voltages YS0 to YS3 is applied to the gates of four first select gates 501 provided to one block region 214. The other end of each of the four first select gates 501 is connected in common with an I/O line. As shown in FIG. 30, eight I/O0 to I/O7 are provided corresponding to eight block regions 214 [0] to 214 [7].

The second transistors 502, of which the gate voltage is one of /YS0 to /YS3, are connected in the middle of the bit lines BL0 to BL3 in the same manner as in FIG. 22. In the example shown in FIG. 30, when the second transistor 502 is turned ON, the voltage BLVS connected with the source of the transistor 501 is supplied to the bit line BL. The voltage BLVS is set at either Vdd or 0 V depending upon the operation mode (see Tables 4 and 5). Therefore, in the present embodiment, the switch 503 and the constant current source 504 are not provided, differing from FIG. 22.

The feature of the Y-pass circuit 412 shown in FIG. 30 is provision of the second select gate 510. The second select gate 510 allows the bit line BL0 located at the boundary between the block region 214 [0] and the block region 214 [1] to be connected with or disconnected from the I/O output line (I/O0), for example. The second select gate 510 is connected with the bit line (bit line BL0) which is connected with the connect line 600 between a pair of memory cells 100 disposed in the i-th and (i+1)th block regions (1≦i≦7 in the example shown in FIG. 30) adjacent in the row direction and located at the boundary between the block regions. The second select gate 510 is also provided to the bit line BL0 connected with the dummy cell 101 on the right end shown in FIG. 30. A gate voltage YS4 is supplied to the second select gate 510.

The voltage at each point when reading data in the case where one of eight cells C0 to C7 in one block region 214 is selected as the selected cell is shown in Table 4.

Table 4 shows the voltage at each point in the reverse read operation. For example, in the case of reading data from the selected cell C3, only the gate voltage YS1 of the first select gate 501 is set at Vdd so that only the first select gate 501 connected with the bit line BL1 connected with the opposite cell C2 is turned ON. Other gate voltages YS0 and YS2 to YS4 are set at 0 V.

The second select gate 510 is turned ON only in the case of reading data from the selected cell C6 (first non-volatile memory element) in the reverse read mode. In the reverse read operation, current flows through the bit line BL0 which belongs to the block region 214 [1] based on data in the selected cell C6 which belongs to the block region 214 [0], for example. At this time, since YS0=0 V, /YS0=0 V, and YS4=Vdd as shown in Table 4, only the second select gate 510 connected with the bit line BL0 is turned ON. Therefore, the bit line BL0 in the block region 214 [1] and I/O0 corresponding to the block region 214 [0] are connected, whereby the current flowing through the bit line BL0 can be sensed in I/O0.

In the case of reading data from the selected cell C6, the control gate lines CG2 and CG3 in the block region 214 [0] are respectively set at 0 V and 1.5 V, and the control gate lines CG0 and CG1 in the block region 214 [1] are respectively set at 3 V and 0 V.

As described above, data is read from the selected cell C6 which belongs to the block region 214 [0] by using the bit line and the control gate line which belong to the block region 214 [1] adjacent to the block region 214 [0].

In the case of performing the forward read operation differing from Table 4, the second select gate 510 is turned ON when reading data from the selected cell C7 (second non-volatile memory element), and current flowing through the bit line BL0 is sensed in I/O0.

The voltage at each point when programming data in the case where one of eight cells C0 to C7 in one block region 214 is selected as the selected cell is shown in Table 5.

TABLE 4

| Address | | | Selected | Control Gate | | | | Y-Select Gate | | | | |
|---|---|---|---|---|---|---|---|---|---|---|---|---|
| A14 | A13 | A12 | Cell | CG0 | CG1 | CG2 | CG3 | YS0 | YS1 | YS2 | YS3 | YS4 |
| 0 | 0 | 0 | C0 | 1.5 V | 3.0 V | 0 V | 0 V | 0 V | Vdd | 0 V | 0 V | 0 V |
| 0 | 0 | 1 | C1 | 3.0 V | 1.5 V | 0 V | 0 V | Vdd | 0 V | 0 V | 0 V | 0 V |
| 0 | 1 | 0 | C2 | 0 V | 1.5 V | 3.0 V | 0 V | 0 V | 0 V | Vdd | 0 V | 0 V |
| 0 | 1 | 1 | C3 | 0 V | 3.0 V | 1.5 V | 0 V | 0 V | Vdd | 0 V | 0 V | 0 V |
| 1 | 0 | 0 | C4 | 0 V | 0 V | 1.5 V | 3.0 V | 0 V | 0 V | 0 V | Vdd | 0 V |
| 1 | 0 | 1 | C5 | 0 V | 0 V | 0 V | 1.5 V | 0 V | 0 V | Vdd | 0 V | 0 V |
| 1 | 1 | 0 | C6 | 3.0 V | 0 V | 0 V | 1.5 V | 0 V | 0 V | 0 V | 0 V | Vdd |
| 1 | 1 | 1 | C7 | 1.5 V | 0 V | 0 V | 3.0 V | 0 V | 0 V | 0 V | Vdd | 0 V |

| Y-Deselect Gate | | | | BL Vss | | | |
|---|---|---|---|---|---|---|---|
| /YS0 | /YS1 | /YS2 | /YS3 | BLVS0 | BLVS1 | BLVS2 | BLVS3 |
| Vdd | 0 V | Vdd | Vdd | 0 V | 0 V | Vdd | 0 V |
| 0 V | Vdd | Vdd | Vdd | 0 V | 0 V | 0 V | Vdd |
| Vdd | Vdd | 0 V | Vdd | 0 V | 0 V | 0 V | Vdd |
| Vdd | 0 V | Vdd | Vdd | Vdd | 0 V | 0 V | 0 V |
| Vdd | Vdd | Vdd | 0 V | Vdd | 0 V | 0 V | 0 V |
| Vdd | Vdd | 0 V | Vdd | 0 V | Vdd | 0 V | 0 V |
| 0 V | Vdd | Vdd | Vdd | 0 V | Vdd | 0 V | 0 V |
| Vdd | Vdd | Vdd | 0 V | 0 V | 0 V | Vdd | 0 V |

TABLE 5

Program

| Address | | | Selected Cell | Control Gate | | | | Y-Select Gate | | | | |
|---|---|---|---|---|---|---|---|---|---|---|---|---|
| A14 | A13 | A12 | | CG0 | CG1 | CG2 | CG3 | YS0 | YS1 | YS2 | YS3 | YS4 |
| 0 | 0 | 0 | C0 | 5.5 V | 2.5 V | 0 V | 0 V | 7 V | 0 V | 0 V | 0 V | 0 V |
| 0 | 0 | 1 | C1 | 2.5 V | 5.5 V | 0 V | 0 V | 0 V | 7 V | 0 V | 0 V | 0 V |
| 0 | 1 | 0 | C2 | 0 V | 5.5 V | 2.5 V | 0 V | 0 V | 7 V | 0 V | 0 V | 0 V |
| 0 | 1 | 1 | C3 | 0 V | 2.5 V | 5.5 V | 0 V | 0 V | 0 V | 7 V | 0 V | 0 V |
| 1 | 0 | 0 | C4 | 0 V | 0 V | 5.5 V | 2.5 V | 0 V | 0 V | 7 V | 0 V | 0 V |
| 1 | 0 | 1 | C5 | 0 V | 0 V | 2.5 V | 5.5 V | 0 V | 0 V | 0 V | 7 V | 0 V |
| 1 | 1 | 0 | C6 | 2.5 V | 0 V | 0 V | 5.5 V | 0 V | 0 V | 0 V | 7 V | 0 V |
| 1 | 1 | 1 | C7 | 5.5 V | 0 V | 0 V | 2.5 V | 0 V | 0 V | 0 V | 0 V | 7 V |

| Y-Deselect Gate | | | | BL Vss | | | |
|---|---|---|---|---|---|---|---|
| /YS0 | /YS1 | /YS2 | /YS3 | BLVS0 | BLVS1 | BLVS2 | BLVS3 |
| 0 V | Vdd | Vdd | Vdd | 0 V | 0 V | 0 V | Vdd |
| Vdd | 0 V | Vdd | Vdd | 0 V | 0 V | Vdd | 0 V |
| Vdd | 0 V | Vdd | Vdd | Vdd | 0 V | 0 V | 0 V |
| Vdd | Vdd | 0 V | Vdd | 0 V | 0 V | 0 V | Vdd |
| Vdd | Vdd | 0 V | Vdd | 0 V | Vdd | 0 V | 0 V |
| Vdd | Vdd | Vdd | 0 V | Vdd | 0 V | 0 V | 0 V |
| Vdd | Vdd | Vdd | 0 V | 0 V | 0 V | Vdd | 0 V |
| 0 V | Vdd | Vdd | Vdd | 0 V | Vdd | 0 V | |

As shown in Table 5, when programming data in the selected cell C7, the second select gate 510 is turned ON by setting the voltage YS4 at 7 V. In this case, the selected cell C7 is connected with the bit line driver (not shown) through the bit line BL0, the second select gate 510, and I/O0, whereby the bit line voltage for programming is supplied to the bit line BL0.

The control gate lines CG2 and CG3 in the block region 214 [0] are respectively set at 0 V and 2.5 V, and the control gate lines CG0 and CG1 in the block region 214 [1] are respectively set at 5.5 V and 0 V during this operation.

As described above, data is programmed in the selected cell C6 which belongs to the block region 214 [0] by using the bit line and the control gate line which belong to the block region 214 [1] adjacent to the block region 214 [0].

Since the voltage setting in one sector is the same between the block regions when erasing data, the voltage setting is as shown in Table 6.

opposite ends of one block region 214 in the row direction. Five bit lines BL0 to BL4 are provided to one block region 214. The first select gates 501 are provided in the middle of each of the bit lines BL0 to BL4.

Since the dummy cells 101 must be provided between the block regions, the length in the row direction is increased, whereby an increase in integration is hindered.

In particular, in the case of dividing the memory cell array into sectors in the row direction as shown in FIG. 2A, it is necessary to provide eight or sixteen block regions (I/O memory blocks) 214 corresponding to eight or sixteen I/Os in one sector having a comparatively small width as shown in FIG. 2B. Therefore, since a large number of block regions 214 are disposed in the row direction over the entire memory cell array, the number of dummy cells 101 is considerably increased.

However, since the dummy cells 101 are unnecessary between the block regions in the structure shown in FIG. 30, the degree of integration can be increased.

TABLE 6

Erase

| Address | | | Selected Cell | Control Gate | | | | Y-Select Gate | | | | | Y-Deselect Gate | | | |
|---|---|---|---|---|---|---|---|---|---|---|---|---|---|---|---|---|
| A14 | A13 | A12 | | CG0 | CG1 | CG2 | CG3 | YS0 | YS1 | YS2 | YS3 | YS4 | /YS0 | /YS1 | /YS2 | /YS3 |
| 0 | 0 | 0 | C0 | −3 V | −3 V | −3 V | −3 V | 7 V | 7 V | 7 V | 7 V | 7 V | 0 V | 0 V | 0 V | 0 V |
| 0 | 0 | 1 | C1 | −3 V | −3 V | −3 V | −3 V | 7 V | 7 V | 7 V | 7 V | 7 V | 0 V | 0 V | 0 V | 0 V |
| 0 | 1 | 0 | C2 | −3 V | −3 V | −3 V | −3 V | 7 V | 7 V | 7 V | 7 V | 7 V | 0 V | 0 V | 0 V | 0 V |
| 0 | 1 | 1 | C3 | −3 V | −3 V | −3 V | −3 V | 7 V | 7 V | 7 V | 7 V | 7 V | 0 V | 0 V | 0 V | 0 V |
| 1 | 0 | 0 | C4 | −3 V | −3 V | −3 V | −3 V | 7 V | 7 V | 7 V | 7 V | 7 V | 0 V | 0 V | 0 V | 0 V |
| 1 | 0 | 1 | C5 | −3 V | −3 V | −3 V | −3 V | 7 V | 7 V | 7 V | 7 V | 7 V | 0 V | 0 V | 0 V | 0 V |
| 1 | 1 | 0 | C6 | −3 V | −3 V | −3 V | −3 V | 7 V | 7 V | 7 V | 7 V | 7 V | 0 V | 0 V | 0 V | 0 V |
| 1 | 1 | 1 | C7 | −3 V | −3 V | −3 V | −3 V | 7 V | 7 V | 7 V | 7 V | 7 V | 0 V | 0 V | 0 V | 0 V |

COMPARATIVE EXAMPLE

Figure 31:
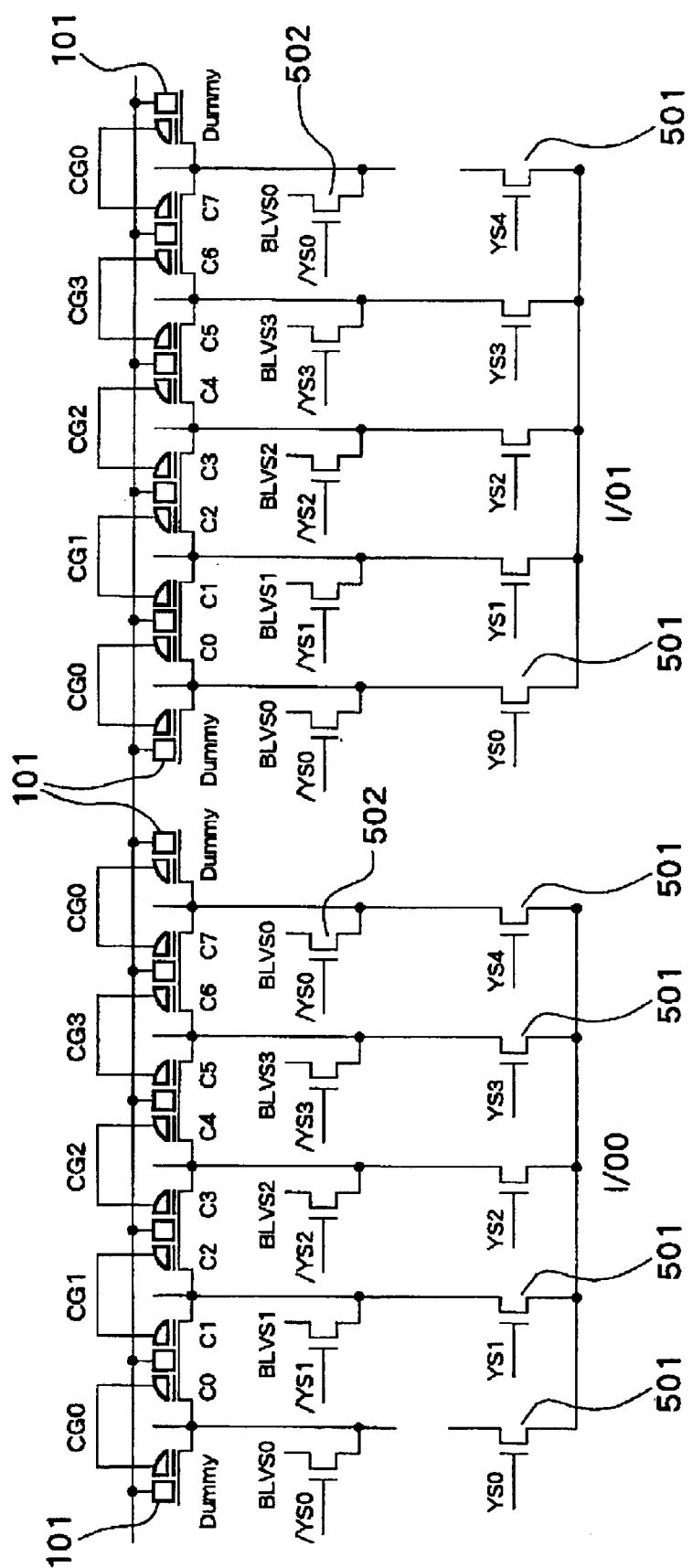
FIG. 31 is a circuit diagram showing a comparative example in which the number of dummy cells is increased in comparison with the Y-pass circuit shown in FIG. 30.

A structure shown in FIG. 31 must be employed unless the second select gate 510 shown in FIG. 30 is used. In FIG. 31, two block regions 214 [0] and 214 [1] are completely separated. Moreover, the dummy cells 101 are provided on The present invention is not limited to the above-described embodiment. Various modifications and variations are possible within the spirit and scope of the present invention.

For example, the structure of the non-volatile memory elements 108A and 108B is not limited to the MONOS structure. The present invention may be applied to a non-volatile semiconductor memory device using various types of other memory cells capable of independently trapping charges at two sites by one word gate 104 and the first and second control gates 106A and 106B.

The number of sector regions, the number of large blocks and small blocks, and the number of memory cells in the small memory block in the above embodiment are only examples. Various modifications are possible. In the above embodiment, the number of large blocks is eight from the viewpoint of limitations to the pitch of the metal interconnects. If the pitch of the metal interconnects can be decreased, the number of large blocks can be further increased. If the number of large blocks is 16, load capacitance (gate capacitance) of one control gate line is further decreased, whereby driving at a higher speed can be achieved. However, the number of main control gate lines is increased if the number of large blocks is 16. Therefore, line and space must be decreased or the area must be increased. Moreover, an increase in the number of control gate drivers results in an increase in the area.

What is claimed is:

1. A non-volatile semiconductor memory device comprising:
    a memory cell array region in which are arranged a plurality of memory cells at least in a row direction, each of the memory cells having first and second non-volatile memory elements that are controlled by one word gate and first and second control gates;
    a plurality of bit lines extending in a column direction, each of the bit lines being connected to a connect line which connects a pair of memory cells adjacent to each other in the row direction;
    a plurality of first select gates, each of which is connected to one of the bit lines; and
    a plurality of I/O lines, each of which is provided for each $2^N$ (N is an integer of 2 or more) first select gates and connected in common to $2^N$ bit lines through $2^N$ first select gates,
    wherein the memory cell array region is divided into a plurality of block regions in the row direction corresponding to the I/O lines, each of the block regions including $2^N$ memory cells in the row direction; and
    wherein a second select gate is provided between one of the I/O lines corresponding to the i-th block region (i is an integer) and one of the bit lines, the bit line being located at a boundary between the block regions and connected to the connect line connecting two of the memory cells respectively disposed in the i-th and (i+1)th block regions that are adjacent to each other in the row direction in the block regions.

2. The non-volatile semiconductor memory device as defined in claim 1,
    wherein the second select gate is driven on condition that the memory cell located in an end portion of the i-th block region and connected to one of the bit lines located at the boundary between the block regions is selected and that the bit line located at the boundary between the block regions is connected to one of the I/O lines corresponding to the i-th block region.

3. The non-volatile semiconductor memory device as defined in claim 2,
    wherein the bit line located at the boundary between the block regions is set at a bit line voltage for programming through the second select gate when programming is performed for the second non-volatile memory element of the memory cell located in an end portion of the i-th block region.

4. The non-volatile semiconductor memory device as defined in claim 2,
    wherein data reading from the first non-volatile memory element of the memory cell located at an end portion of the i-th block region is performed in reverse mode by sensing a current flowing into the I/O line through the second select gate and the bit line located at the boundary between the block regions.

5. The non-volatile semiconductor memory device as defined in claim 2,
    wherein data reading from the second non-volatile memory element of the memory cell located at an end portion of the i-th block region is performed in forward mode by sensing a current flowing into the I/O line through the second select gate and the bit line located at the boundary between the block regions.

6. The non-volatile semiconductor memory device as defined in claim 1,
    wherein the memory cell array region is divided into a plurality of sector regions in the row direction;
    wherein a plurality of independent control gate driver sections are provided for each of the sector regions; and
    wherein each of the control gate driver sections sets the potential of the first and second control gates of the memory cells in a corresponding sector region independently of other sector regions.

7. The non-volatile semiconductor memory device as defined in claim 6,
    wherein a dummy cell having one of the first and second control gates and the word gate is disposed at both ends of each of the sector regions in the row direction.

8. The non-volatile semiconductor memory device as defined in claim 1,
    wherein the bit lines respectively connected to the connect lines are sub bit lines;
    wherein the sub bit lines are commonly connected to a main bit line extending in the column direction with bit line select switching elements interposed; and
    wherein the first and second select gates are connected to the main bit line.

9. The non-volatile semiconductor memory device as defined in claim 1,
    wherein each of the first and second non-volatile memory elements includes an ONO film formed of an oxide film (O), a nitride film (N), and an oxide film (O) as a charge-trapping site, and data is programmed at the trapping site.

10. A method of driving a non-volatile semiconductor memory device comprising:
    providing a non-volatile semiconductor memory device which has: a memory cell array region in which are arranged a plurality of memory cells at least in a row direction, each of the memory cells having first and second non-volatile memory elements that are controlled by one word gate and first and second control gates; a plurality of bit lines extending in a column direction, each of the bit lines being connected to a connect line which connects two of the memory cells adjacent to each other in the row direction; a word line which is connected to the word gates of the memory cells arranged in the row direction; and a plurality of control gate lines each of which is connected to the first and second control gates respectively provided in adjacent two memory cells with the connect line interposed, the memory cell array region being divided into a plurality of block regions in the row direction corresponding to the I/O lines, and each of the block regions including $2^N$ memory cells; and performing a data reading or programming operation for one of the first and second non-volatile memory elements in the i-th memory cell in the row direction by using the word line, four of the bit lines, and four of the control gate lines connected to the (i−1)th, the i-th and the (i+1)th memory cells;

wherein the data reading or programming operation for the i-th memory cell is performed by using the bit line and the control gate line connected to the (i+1)th memory cell in the block region which is different from the block region in which the i-th memory cell is located, when the i-th memory cell is in an end portion of the block region.

11. The method of driving a non-volatile semiconductor memory device as defined in claim 10, wherein the memory cell array region is divided into a plurality of sector regions in the row direction, each of the sector regions having a plurality of the block regions; and wherein the data reading or programming operation is performed by using the word line, four of the bit lines, and four of the control gate lines connected to the (i−1)th, the i-th and the (i+1)th memory cells respectively disposed in adjacent two block regions in each of the sector regions, when the i-th memory cell is in the end portion of the block region.

12. The method of driving a non-volatile semiconductor memory device as defined in claim 11, wherein a dummy cell having one of the first and second control gates and the word gate is disposed at both ends of each of the sector regions in the row direction; and wherein the data reading or programming operation is performed for the i-th memory cell by using the bit line and the control gate line connected to the (i−1)th or (i+1)th dummy cell, when the i-th memory cell is in the end portion of the sector region.

* * * * *